(12) United States Patent
Mitsui et al.

(10) Patent No.: US 7,102,704 B2
(45) Date of Patent: Sep. 5, 2006

(54) DISPLAY

(75) Inventors: Seiichi Mitsui, Kitakatsuragi-gun (JP); Masaaki Kabe, Atsugi (JP); Teiyu Sako, Kuki (JP); Hideki Uchida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 202 days.

(21) Appl. No.: 10/078,925

(22) Filed: Feb. 19, 2002

(65) Prior Publication Data

US 2002/0145687 A1 Oct. 10, 2002

(30) Foreign Application Priority Data

Feb. 20, 2001 (JP) .............. 2001-043234
Feb. 7, 2002 (JP) .............. 2002-031448

(51) Int. Cl.
*G02F 1/13* (2006.01)

(52) U.S. Cl. ..................... 349/62
(58) Field of Classification Search ........... 349/62
See application file for complete search history.

(56) References Cited

U.S. PATENT DOCUMENTS

| | | | |
|---|---|---|---|
| 6,340,999 B1* | 1/2002 | Masuda et al. | 349/63 |
| 6,441,881 B1* | 8/2002 | Enomoto et al. | 349/156 |
| 6,582,091 B1* | 6/2003 | Funamoto et al. | 362/31 |

FOREIGN PATENT DOCUMENTS

| JP | 03-071111 | 3/1991 |
|---|---|---|
| JP | 05-173193 | 7/1993 |
| JP | 08-211832 | 8/1996 |
| JP | 08-321380 | 12/1996 |
| JP | 09-127885 | 5/1997 |
| JP | 10-054911 | 2/1998 |
| JP | 10-125461 | 5/1998 |
| JP | 10-213799 | 8/1998 |
| JP | 11-249132 | 9/1999 |
| JP | 11-249133 | 9/1999 |
| JP | 11-329745 | 11/1999 |

(Continued)

OTHER PUBLICATIONS

Emiel Peeters, et al., "Circularly Polarized Electroluminescence from a Polymer Light-Emitting Diode," J. Am. Chem. Soc., vol. 119, No. 41, 1997 (pp. 9909-9910).

*Primary Examiner*—James A. Dudek
(74) *Attorney, Agent, or Firm*—David G. Conlin; Steven M. Jensen; Edwards Angell Palmer & Dodge LLP

(57) ABSTRACT

A display includes a polarizing member and a reflective display element behind an EL element. The EL element self-emits light to display information and doubles as a display-use light source for the reflective display element. In a sufficiently bright environment, ambient light enters a liquid crystal layer after passing through a frontal substrate of the reflective display element, and is reflected from a metal electrode to produce displays. In addition to the direct light from the EL element, light that enters the liquid crystal layer is simultaneously used. In a dark environment, the EL element emits light, and displayed contents are visible owing to the reflection from the metal electrode as well as directly exiting light. The structure makes it possible to provide a novel type of display that allows a user to select one of various display modes at his/her own discretion according to surrounding conditions and that also shows information in a clearly visible fashion, be it outdoors under clear skies or in a dark place, without giving up their thin, lightweight features.

3 Claims, 26 Drawing Sheets

FOREIGN PATENT DOCUMENTS

| | | |
|---|---|---|
| JP | 2000-214475 | 8/2000 |
| JP | 2000-241807 | 9/2000 |
| JP | 2000-267097 | 9/2000 |
| JP | 2001-035653 | 2/2001 |

* cited by examiner

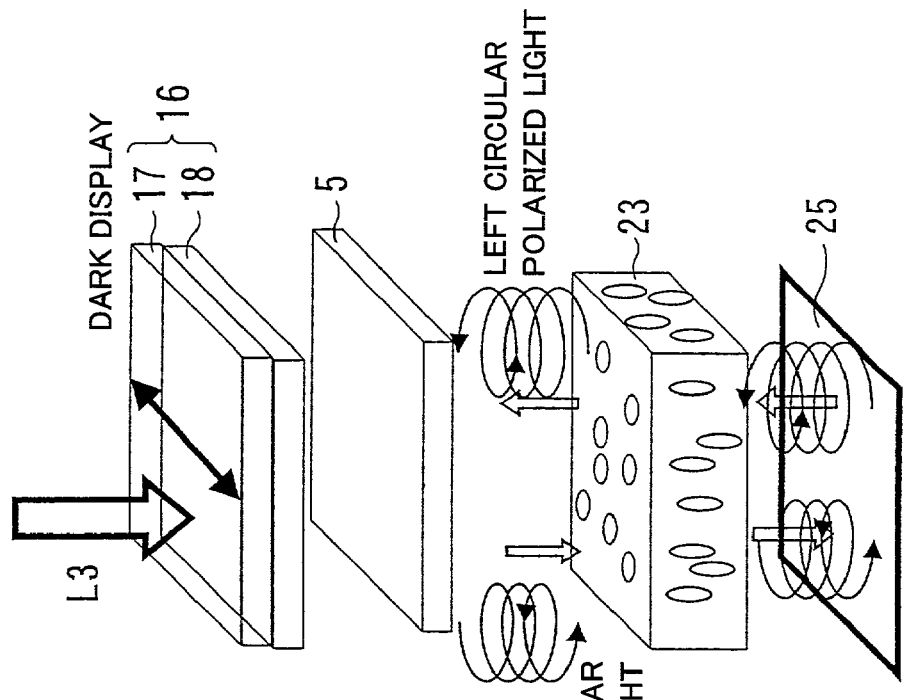
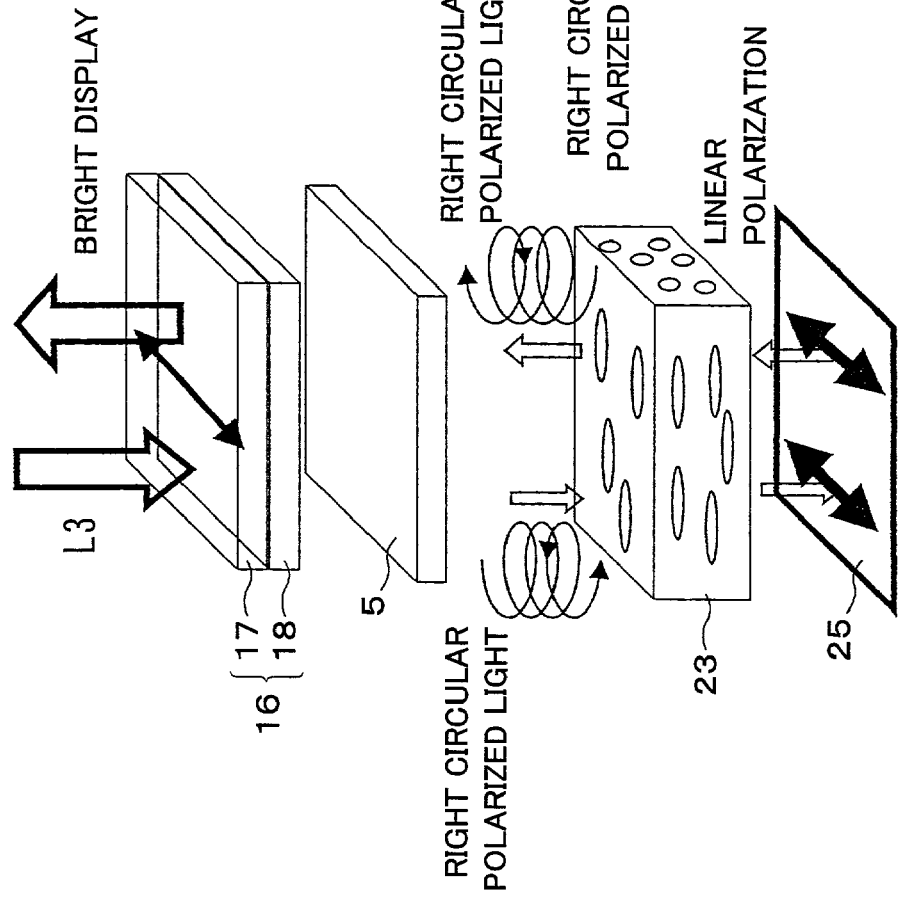

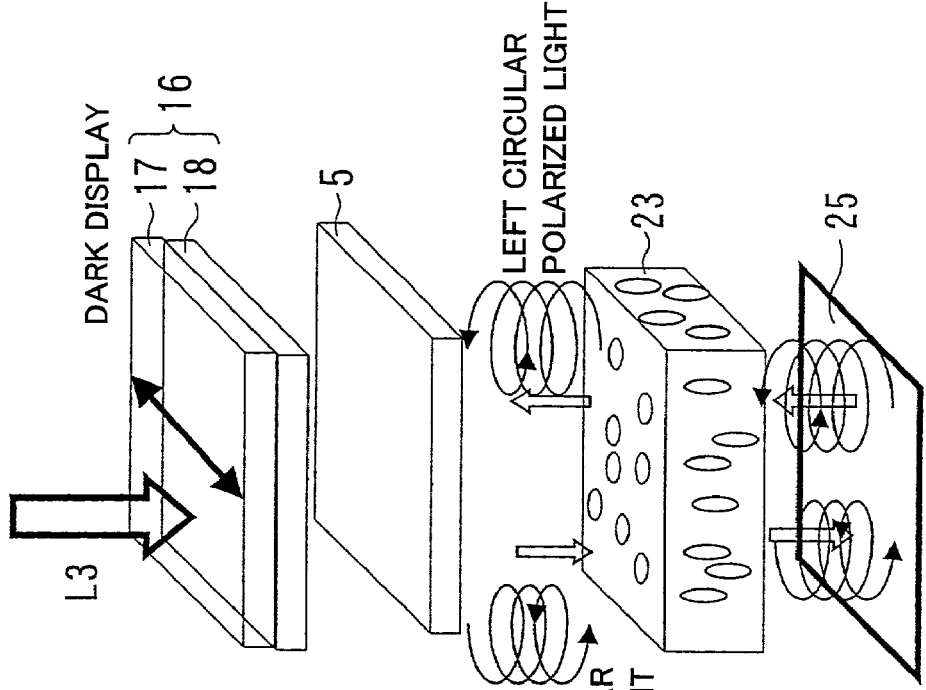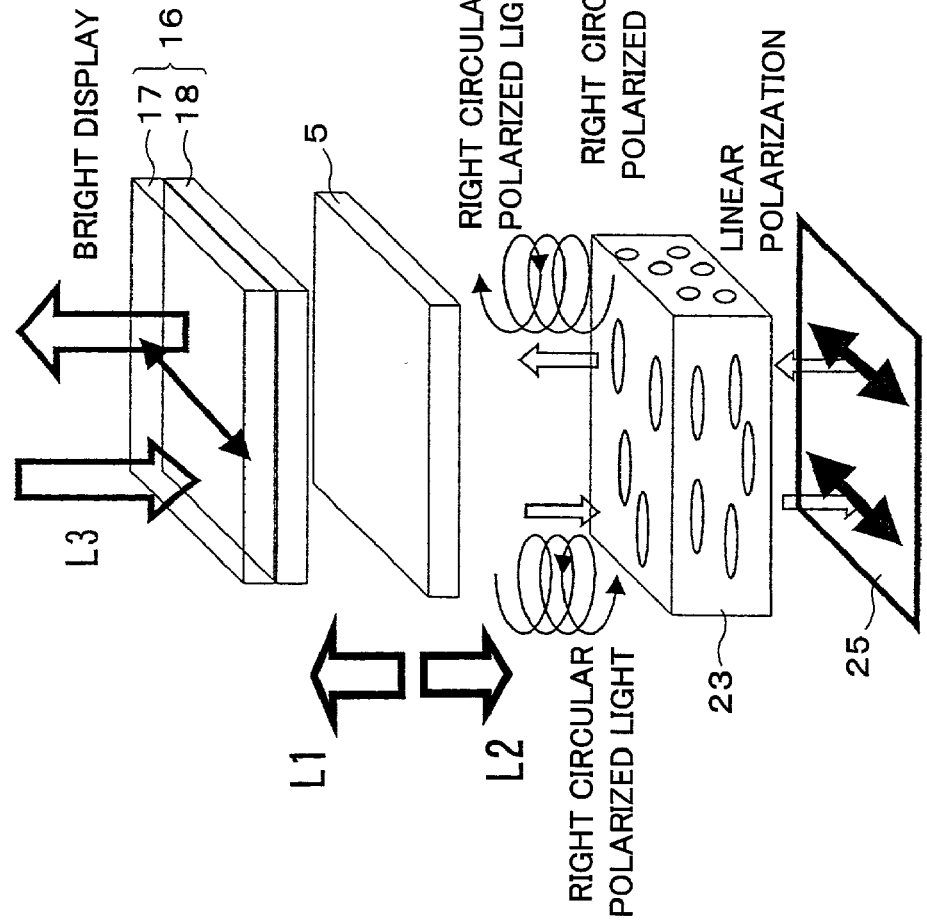

DISPLAY

FIELD OF THE INVENTION

The present invention relates to thin, lightweight displays incorporated in various word processors, laptop personal computers, and other IT devices, video displays and game machines, portable VTRs, digital cameras, etc., especially those intended for use both indoors and outdoors and in vehicles, aircraft, vessels, and other environments in which illumination conditions change rapidly and harshly.

BACKGROUND OF THE INVENTION

Displays capable of electrically rewriting a screen are classified as emissive types that emit light by themselves and non-emissive types that use ambient light for illumination. Thin, lightweight emissive displays include electroluminescence (EL) elements and plasma display panels (PDPs) and non-emissive counterparts include liquid crystal displays. These displays are already available for commercial use.

The liquid crystal display have low contrast, narrow viewing angles, and other shortcomings. A lot of research efforts are put into the development of inorganic and organic EL displays, both belonging to the emissive class of displays, to exploit their properties which readily overcome the disadvantages of liquid crystal displays.

FIG. 25 is a cross-sectional view showing, as an example, the structure of an organic EL display element. In the figure, an organic EL element 1 principally includes an transparent ITO (indium tin oxide) electrode 3, hole transfer layer 4, light-emitting layer 5, electron transfer layer 6, and cathode (for example, aluminum electrode) 7, formed sequentially by, for example, vacuum vapor deposition on a transparent substrate 2 made of glass or other material. Selectively applying a d.c. voltage 8 to the cathode 7 and the transparent electrode 3 acting as an anode moves the holes created in the transparent electrode 3 through the hole transfer layer 4 and the electrons created in the cathode 7 through the electron transfer layer 6 to the light-emitting layer 5 where the electrons and holes are recombined and release light at a predetermined wavelength. An observer can view the produced light L coming out through the transparent substrate 2.

The light-emitting layer 5 may contain, for example, complex compounds of aluminum and zinc. In actual practice, the layer may be made of either an aluminum complex (aluminum complexes are also possible) or a zinc complex (zinc complexes are also possible) with or without additional luminescent material.

The structure entails a problem termed "washout" where intense ambient light in comparison to the light produced by the device, having entered the transparent substrate 2 and been reflected from the cathode 7, produces exceedingly high luminance for a non-emitting state, i.e., black state, reducing contrast greatly and making the screen unrecognizable. The important issue here is to find how to reduce reflected ambient light.

A solution is offered by Japanese Laid-open Patent Application No. 9-127885/1997 (Tokukaihei 9-127885: published on May 16, 1997) disclosing a structure in which circularly polarizing means 11, constituted by a polarizing plate 9 and a quarter-wave plate 10, is disposed in front of the transparent substrate 2 as shown in FIG. 26. With the structure, ambient light incident at the transparent substrate 2 becomes circularly polarized by the polarizing plate 9 and the quarter-wave plate 10. Reflected from the cathode (aluminum electrode) 7 in the organic EL element, the light is still circularly polarized, but oppositely. As the light again passes through the quarter-wave plate 10, it changes its polarization from oppositely circular to parallel to the absorption axis of the polarizing plate 9. The light is therefore absorbed by the polarizing plate 9. Put differently, the ambient light is less reflected. Good contrast thus becomes available. This prevents reflection from mirror-like metal electrodes and loss of contrast.

As to color displays, non-emissive liquid crystal displays are put in practical use. Popularly used among them are transmissive types with a light source in the back, which are enjoying a wide range of applications due to their outstandingly small thickness and light weight when compared to other types of displays. Although only a small amount of energy is needed to modulate the transmittance of a liquid crystal element, the backlight must be continuously powered on no matter what is being displayed; the non-emissive liquid crystal display overall requires large power for its operation. Transmissive color liquid crystal displays are also highly power-consuming, since the backlight emits light in an increased amount to address the problem of low visibility of the display under intense ambient light by boosting the otherwise relatively moderate luminance.

In contrast to these emissive displays and transmissive liquid crystal displays, the reflective liquid crystal display is characterized by its capability to produce display light in an amount proportional to that of ambient light and resultant theoretical immunity to washout. Further, with no need for a backlight, the display can save power for an illumination light source. Conversely, since the reflective liquid crystal display depends on reflected light to produce displays, the displays are not clearly visible under mild ambient light. The problem becomes more evident when color is implemented by the use of a color filter, which absorbs light and further reduces the luminance of the screen.

To enable the use of the reflective liquid crystal display under mild ambient light, a device, typically termed frontlight illumination device, is suggested which is disposed on the screen side of the reflective liquid crystal display to provide illumination. For example, Japanese Laid-open Patent Application No. 11-249132/1999 (Tokukaihei 11-249132; published on Sep. 17, 1999) and No. 11-249133/1999 (Tokukaihei 11-249133; published on the same date) disclose a structure in which an organic EL element is provided as the frontlight on the substrate, of a reflective liquid crystal display, which faces the observer. Meanwhile, Japanese Laid-open Patent Application No. 10-125461/1998 (Tokukaihei 10-125461: published May 15, 1998) discloses a structure in which an organic EL element is provided as the backlight on the back of a liquid crystal display with a metal electrode in the organic EL element doubling as a reflecting plate and another structure in which a transparent organic EL element is provided as an auxiliary light source on a reflective liquid crystal display.

The invention of Tokukaihei 9-127885 restrains development of washout by the provision of the circularly polarizing means. However, the technique is not a result of constructive use of ambient light in display operations: the EL element emits non-polarized light due to the presence of the circularly polarizing plate with about 50% of the light absorbed by that polarizing plate. Results are emission intensity and efficiency which are reduced by about 50%. As would be clear from the description, the element with ambient-light-reflection-preventing means constituted by a polarizing plate and a wave plate has a poor light emission intensity and efficiency which are about half those of the element without the means.

In the inventions as detailed in Tokukaihei 11-249132 and Tokukaihei 11-249133, an organic EL element is located in regions where no display electrodes are located, reducing the effective aperture ratio. On top of it, a cathode made of a magnesium-indium alloy is disposed on the side facing the observer and reflects incoming light back to the observer, reducing contrast. These published applications describe the organic EL element only as a frontlight.

The invention as detailed in Tokukaihei 10-125461 uses the cathode of the organic EL element playing a dual role as a reflecting plate. The structure forms a mirror-like surface and cannot produce a bright white screen with wide viewing angles. Besides, the structure in which the transparent organic EL element is placed in front of the reflective liquid crystal display element allows reflection of ambient light, causing display quality to fall far below satisfactory level. The touch panel, stacked on the display for use, which is disclosed in the application, reflects ambient light and degrades visibility: the unwelcome properties manifest themselves clearly in reflective liquid crystal displays.

The organic EL elements mentioned so far all emit non-polarized light. Research is underway recently for organic EL material emitting polarized light. Emiel Peeters, et al. reported in an article published in J. Am. Chem. Soc. 1997, 119, 9909–9910 that they are conducting research for material that emits circularly polarized light satisfying g≠0, g being given by $$g=2(I_L-I_R)/(I_L+I_R)$$

where $I_R$ is the intensity of right circularly polarized light and $I_L$ is the intensity of left circularly polarized light. They, however, mentioned nothing about an optimum device structure to make use of the material.

SUMMARY OF THE INVENTION

The present invention, in view of the above problems, has an objective to achieve high visibility displays in both bright and dark environments on reflective types of displays without losing their features, small thickness and light weight, by utilizing ambient light and light emitted by an EL element.

Another objective is to provide a novel structure for emissive types of displays which utilizes ambient light for displays to cut down on energy consumption under intense ambient light by decreasing the emission from an emissive element, while retaining the overall luminance of the display element by increasing the contribution from the reflective liquid crystal.

A further objective is to achieve high quality displays free of ambient light reflection on a display equipped with a touch panel.

To accomplish the objectives, a display in accordance with the present invention is characterized in that it includes:

a circularly polarizing member for selectively transmitting substantially circularly polarized light, either right or left, from external light; and a light-transmitting EL element, wherein there is provided a reflective display element behind the EL element.

The present invention hence offers novel, versatile types of displays, totally different from conventional ones, by making use of features of a circularly polarizing member and an EL element in combination with a reflective display element having a light-reflecting section. The invention also offers displays that show information in a clearly visible fashion, be it outdoors under clear skies or in a dark place, without giving up their thin, lightweight features. The invention also offers novel types of displays that allow a user to select one of various display modes at his/her own discretion according to surrounding conditions.

A display in accordance with the present invention is characterized in that it includes:

an EL element; and reflective display element, provided behind the EL element, including at least light-reflecting section, wherein the EL element and the reflective display element are independently controllable in terms of display operations.

As detailed above, the invention realizes displays capable of making use of both ambient light and light emitted by an EL element to present information in a clearly visible fashion in both bright and dark environments, owing to a combined structure of an EL element and a reflective display element (for example, electrophoresis display element) which are independently controllable in terms of display operations, without giving up the thin, lightweight features of reflective displays.

For a fuller understanding of the nature and advantages of the invention, reference should be made to the ensuing detailed description taken in conjunction with the accompanying drawings.

BRIEF DESCRIPTION OF THE DRAWINGS

FIG. 5(a) is an illustration depicting how the display shown in FIG. 1 uses ambient light to produce a bright screen state without emission from the EL element, and FIG. 5(b) in a dark screen state.

FIG. 8(a) is an illustration depicting how the display shown in FIG. 1 uses light emitted by the EL element and that by the reflective display element to produce a bright screen state, and FIG. 8(b) in a dark screen state

DESCRIPTION OF THE EMBODIMENTS

Embodiment 1

Figure 1:
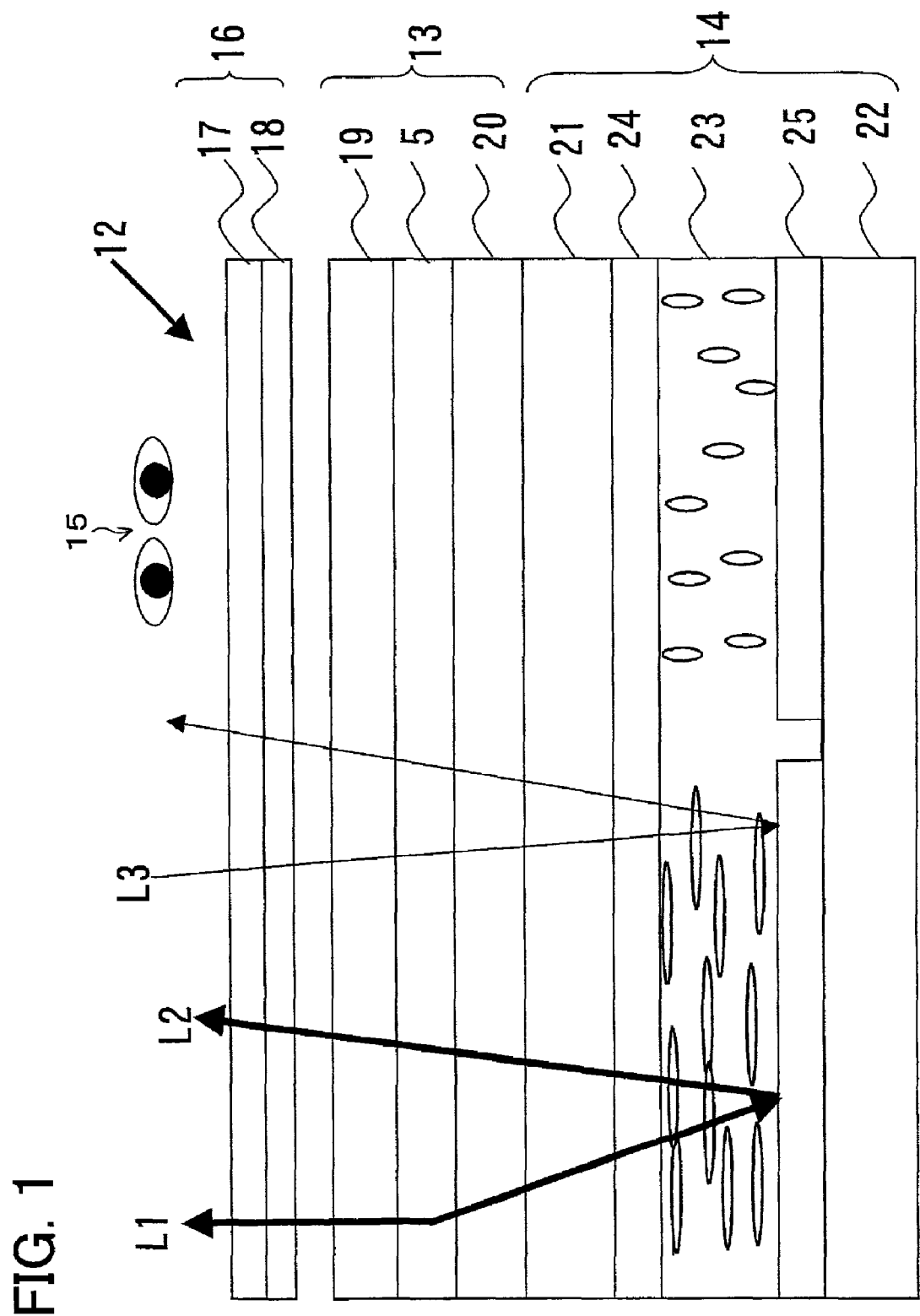
FIG. 1 is a schematic cross-sectional view of a first embodiment of a display in accordance with the present invention.

FIG. 1 is a schematic cross-sectional view of the structure of a display 12, a first embodiment in accordance with the present invention. There is provided a reflective display element 14 integrally on the back of a transmissive EL element 13 and a circularly polarizing means 16 on the side thereof facing an observer 15. These two elements and the observer are located opposite to one another.

It is presumed here that the elements 13, 14 are driven by simple matrix addressing scheme; they may be however driven by active matrix addressing scheme. The EL element is an organic type, the reflective display element is a reflective type containing liquid crystal, and the circularly polarizing means has a layered structure including a polarizing plate 17 and a quarter-wave plate 18; however these are mere examples and by no means intended to restrict the scope of the invention.

The EL element 13 has a light-emitting layer 5 formed on a transparent substrate 19 and is covered with a transparent substrate 20 which is adhered integrally to a transparent substrate 21 which forms a front surface of the reflective display element 14. The reflective display element 14 contains liquid crystal 23 interposed between the transparent substrate 21 and another transparent substrate 22. On the substrate 21 is there provided a transparent electrode 24. Meanwhile, the substrate 22 has a reflective electrode 25 provided thereon.

FIG. 1 indicates behavior of ambient light and light rays emitted by the light-emitting layer 5 In the detailed structure by means of arrows. In the case of a bright screen, some light rays (like L1) emitted by the light-emitting layer 5 exit the device directly toward the observer 15, with some (like L2) exiting the device only after travelling through the liquid crystal layer 23 and being reflected from the reflective electrode 25. Ambient light L3 is transmitted through the EL element 13 and reflected from the reflective electrode 25 in the reflective display element 14 before exiting the device. Thus, L3 in addition to L1, L2 is perceivable to the observer, producing a highly bright screen.

In the case of a dark screen, the EL element 13 emits no light. The ambient light L3 is modulated by the liquid crystal layer not to reach the observer, thereby achieving satisfactory dark states. The provision of the circularly polarizing means 16 enables highly visible displays, because the circularly polarizing means 16 absorbs all the reflection from the interfaces between anodes, cathodes, substrates, and other members which are located behind the means 16. Preferably, the surface of the circularly polarizing means 16 is coated with an anti-reflection film or subjected to an anti-glare treatment.

Figure 2:
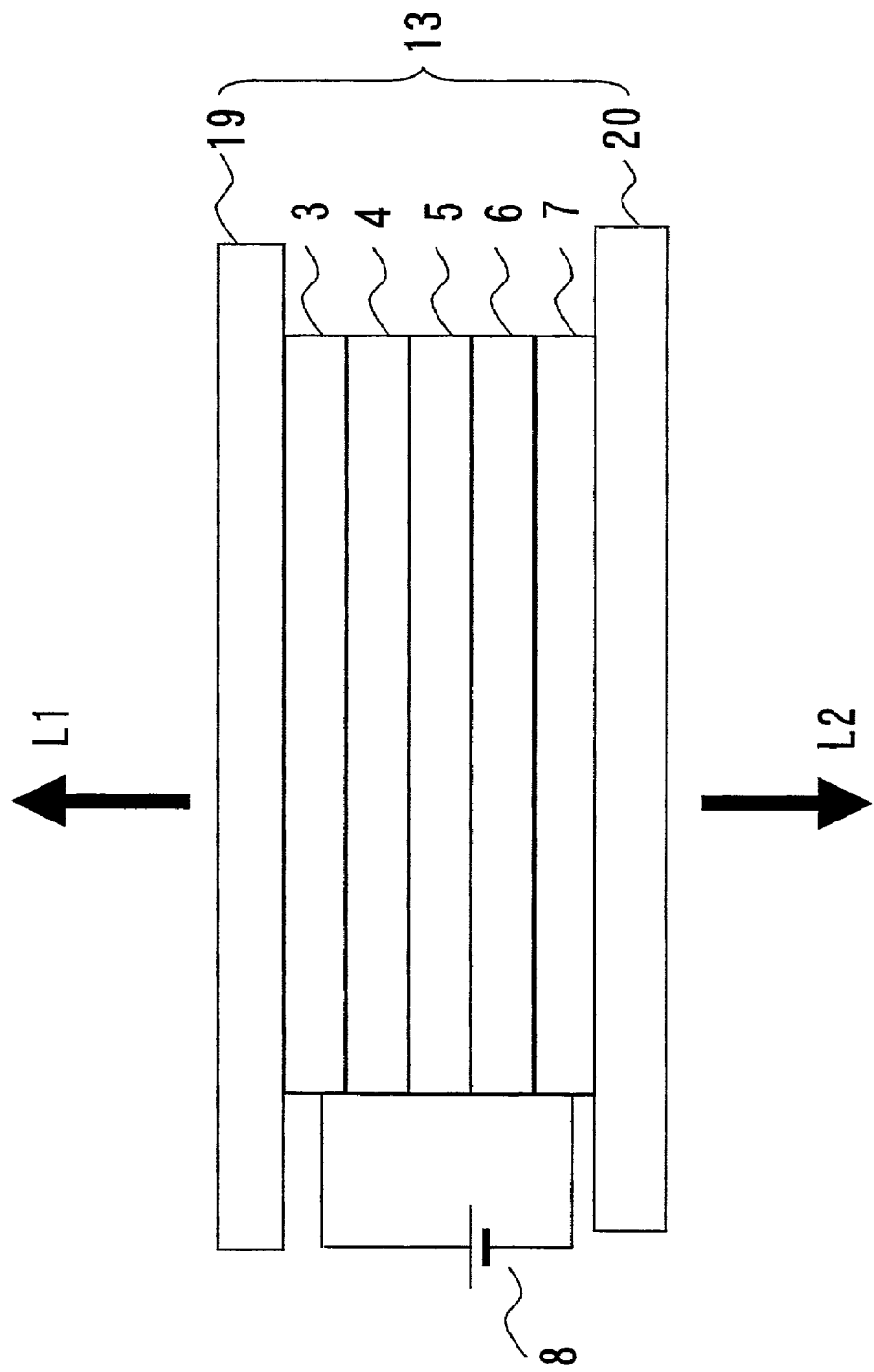
FIG. 2 is a cross-sectional view showing the EL element in FIG. 1 in more detail.

The following will describe in more detail the structure of each member shown in FIG. 1. FIG. 2 is a detailed cross-sectional view of the EL element 13 in FIG. 1. The substrates 19, 20 in the EL element 13 may be made of a permeable material to light, such as plastics, glass, ceramics, or other suitable material. The substrate 20 is preferably as thin as possible to avoid deterioration of display quality of the reflective display element 14. The transparent electrode 3, acting as an anode, may be made of an electrically conductive and optically transmissive material, such as ITO or $SnO_2$.

A hole transfer layer 4, light-emitting layer 5, and electron transfer layer 6 are each made from an electroluminescent, organic thin film and may have one of a variety of conventionally known layer structures to achieve electroluminescence. The metal electrode 7, disposed on the side of the cathode, may be made of a metal alloy of an active metal, such as Li, Mg, or Ca, and another metal, such as Ag, Al, or In. Alternatively, the metal electrode 7 may be made of a combination of these two kinds of metals forming individual, but stacked layers. What matters in the present invention is a cathode which should be as thin and transparent as possible to meet the need for a transmissive type of EL element. In the present embodiment, the cathode has a thickness of 10 nm and a transmittance of 80%. If a high resistance poses a problem, an ITO electrode may be stacked as a transparent electrode on the metal cathode. A metal electrode (cathode) 7 having a transmittance greater than or equal to 50% will realize satisfactory, efficient displays. The stacked body is enclosed by a sealing substrate (transparent substrate) 20 which may be made of any suitable material capable of giving a satisfactory level of sealing.

Thus, applying a d.c. voltage 8 selectively across the transparent electrode 3, an anode, and the cathode 7 moves the holes created in the transparent electrode 3 through the hole transfer layer 4 and the electrons created in the cathode 7 through the electron transfer layer 6 to the light-emitting layer 5 where the electrons and holes are recombined and release light at a predetermined wavelength. The light is visible as it comes out of both sides of the element, i.e., the transparent substrates 19, 20, as the exiting light rays L1, L2.

The light-emitting layer 5 may be made of a wide variety of materials: for example, fluorescent brightening agents, such as benzothiazoles, benzoimidazoles, and benzoxazoles; metal-chelated oxinoid compounds, and styrylbenzene compounds. A light-emitting layer can be made by fabricating a thin film of one of these light-emitting materials by, for example, vapor deposition, spin coating, casting, LB projection, printing, or another known method. In the present embodiment, although a white light-emitting body is used as the light-emitting layer, an RBG light-emitting body and a known material may be used.

Figure 3:
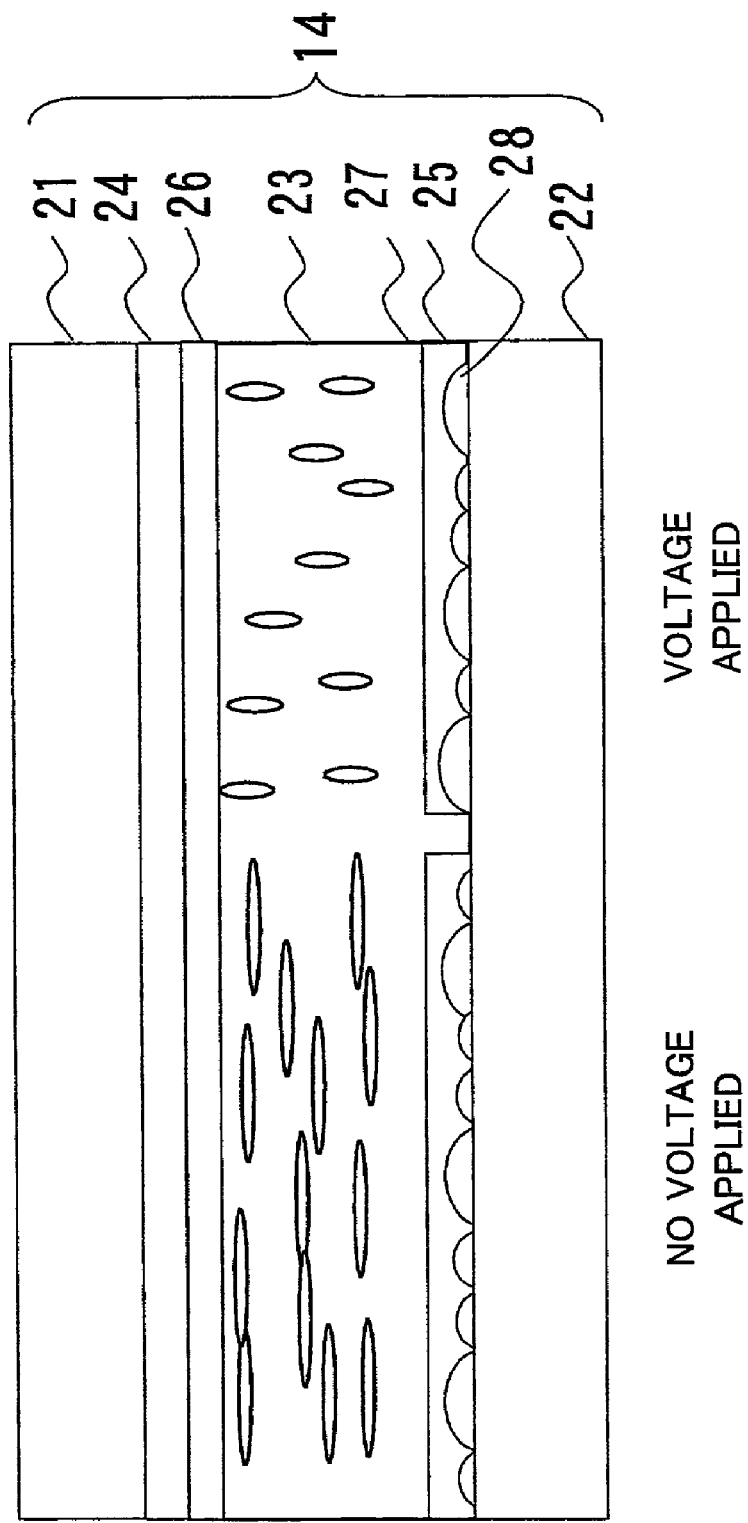
FIG. 3 is a cross-sectional view showing the reflective display element in FIG. 1 in more detail.

FIG. 3 is a detailed cross-sectional view of the reflective display element 14 in FIG. 1. The reflective display element 14 is arranged from transparent substrates 21, 22, a twisted liquid crystal layer 23, a transparent electrode 24, a reflective electrode (light-reflecting means) 25, an undulating film 28, and alignment films 26, 27. The transparent substrates 21, 22, made of glass for example, sandwich the twisted liquid crystal layer 23 having a positive dielectric constant anisotropy. On the transparent substrates 21, 22 are there provided the transparent electrode 24 and the reflective electrode 25 respectively. The alignment films 26, 27 are formed on these electrodes respectively.

The alignment films are subjected to alignment, for example, rubbed on the surfaces thereof, to have the liquid crystal molecules in the liquid crystal layer 23 align parallel to the substrates. Under these circumstances and no applied voltage, the liquid crystal is set to a 63° twist angle, as an example. The product, And, of the birefringence of the liquid crystal and the thickness of the liquid crystal layer, measured in micrometers, is equal to 0.205. The relationship holds for any liquid crystal layer as long as the layer satisfies ¼ wavelength requirements.

When the ¼ wavelength requirements are met, circularly polarized light, entering and traveling through a liquid crystal layer, becomes linearly polarized when it exits the layer. By controlling the alignment state of the liquid crystal layer with an electric field, can be achieved a dark state in which substantially circularly polarized incident light to the liquid crystal layer retains its polarization upon reflection and becomes circularly polarized in the opposite direction upon exiting the layer and a bright state in which substantially circularly polarized incident light to the liquid crystal layer becomes linearly polarized upon reflection and changes back to the circular polarization in the original direction upon leaving the layer. The liquid crystal may be a nematic or smectic liquid crystal having a negative dielectric constant anisotropy.

The transparent electrode 24 is made of, for example, ITO, whereas the reflective electrode 25 is made of aluminum, silver, or another like metal. The electrode 25 may be inherently reflective; however, In the present invention, an alternative is taken where the substrate 22 is provided on the exterior thereof with reflecting means. Examples of such means include light-reflecting films including hologram reflective films and dielectric multilayer film mirrors.

In the present embodiment, to impart reflectivity to the electrode 25, an undulating film 28 is disposed which has an uneven surface to such an extent that the lumps and dents may not disturb the polarization of light upon reflection, to enhance visibility. These non-disturbing lumps and dents can be fabricated from photosensitive resin using a predetermined mask. Since they are not supposed to disrupt alignment of the liquid crystal, they are preferably not higher than 2 µm. By thus imparting suitable diffusivity and directivity to the reflective film, ambient light can be utilized efficiently to produce a bright reflective display element.

Voltage application means (not shown) is connected to the electrodes 24, 25 to apply a controlled voltage across the element in accordance with the contents to be displayed for proper displays. The electrodes 24, 25 are arranged to receive voltage to develop an electric field in the liquid crystal layer. Alternatively, voltage may be directly applied to a display section, for example, externally to the liquid crystal element, or TFT, MIM, or other types of active elements may be provided. When this is the case, as the liquid crystal layer is used nematic liquid crystal having a positive dielectric constant anisotropy.

Figure 4:
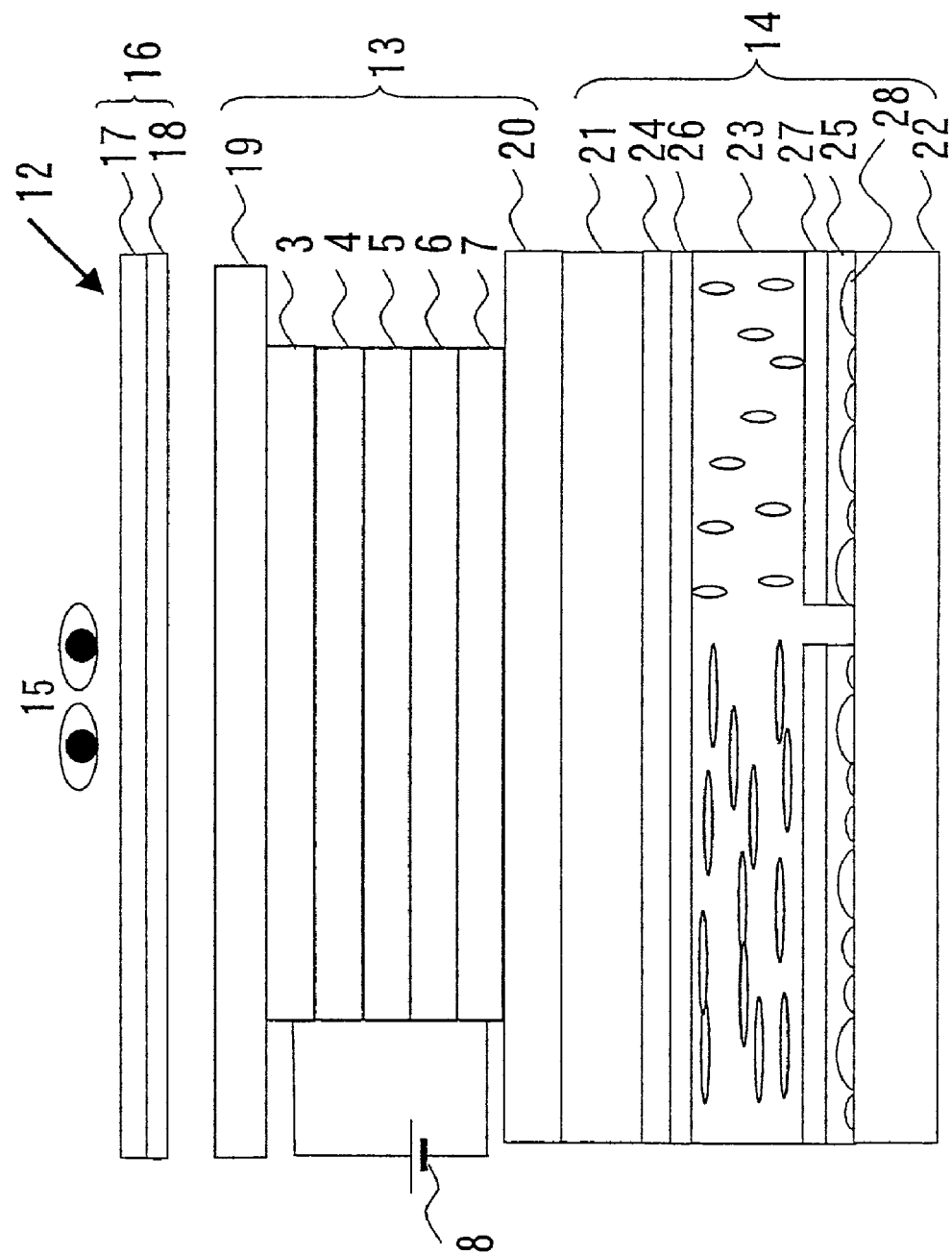
FIG. 4 is a detailed cross-sectional view of the display in FIG. 1.

FIG. 4 is a detailed view of the structure of the display 12 in FIG. 1 in accordance with the present invention, in which the EL element 13 in FIG. 2 is adhered to the reflective display element 14 in FIG. 3 and the circularly polarizing means 16 is disposed on a side facing the observer 15. Since the EL element 13 is transparent, the structure may vary. For example, the substrate 19 may be adhered to the reflective display element 14. The circularly polarizing means 16 is preferably disposed on the side facing the observer, but may be disposed anywhere as long as it is in front of the reflective display element 14, for example, between the transparent substrates 20, 21.

Now, the following will describe operations of a display in accordance with the present invention on a case-by-case basis according to ambient light conditions. FIGS. 5(a), 5(b) show operations under sufficient ambient light with no emission from the EL element: only ambient light is used, and only the reflective display element is driven. In the bright screen state shown in FIG. 5 (a), circularly polarized light passes through the polarizing plate 17 and the quarter-wave plate 18, before entering the twisted liquid crystal layer 23. As exiting the twisted liquid crystal layer 23, the circularly polarized light emerges having linear polarization. The light remains unchanged in polarization upon the reflection from the reflective film 25, but changes, upon a second passage through the twisted liquid crystal layer, from linear polarization to circular polarization whose plane of polarization rotates in the same direction as the incoming light. The resultant light exits the polarizing plate without undergoing any changes, thereby achieving a bright screen.

In the dark screen state shown in FIG. 5(b), under the influence of applied voltage, the liquid crystal layer is freed from twists and aligns to the electric field. Likewise, circularly polarized light passes through the polarizing plate and the quarter-wave plate, before entering the liquid crystal layer. The incident circularly polarized light to the liquid crystal layer 23 passes the layer, retaining its polarization. Upon reflection from the reflective film 25, the light preserves its circular polarization, but changes the direction by 180°. As the light passes through the liquid crystal layer 23 and the quarter-wave plate 18 again, it becomes linearly polarized with a conversion of 90° when compared to the original, circularly polarized light. The linearly polarized light is absorbed by the polarizing plate 17, achieving a dark screen.

Figure 6:
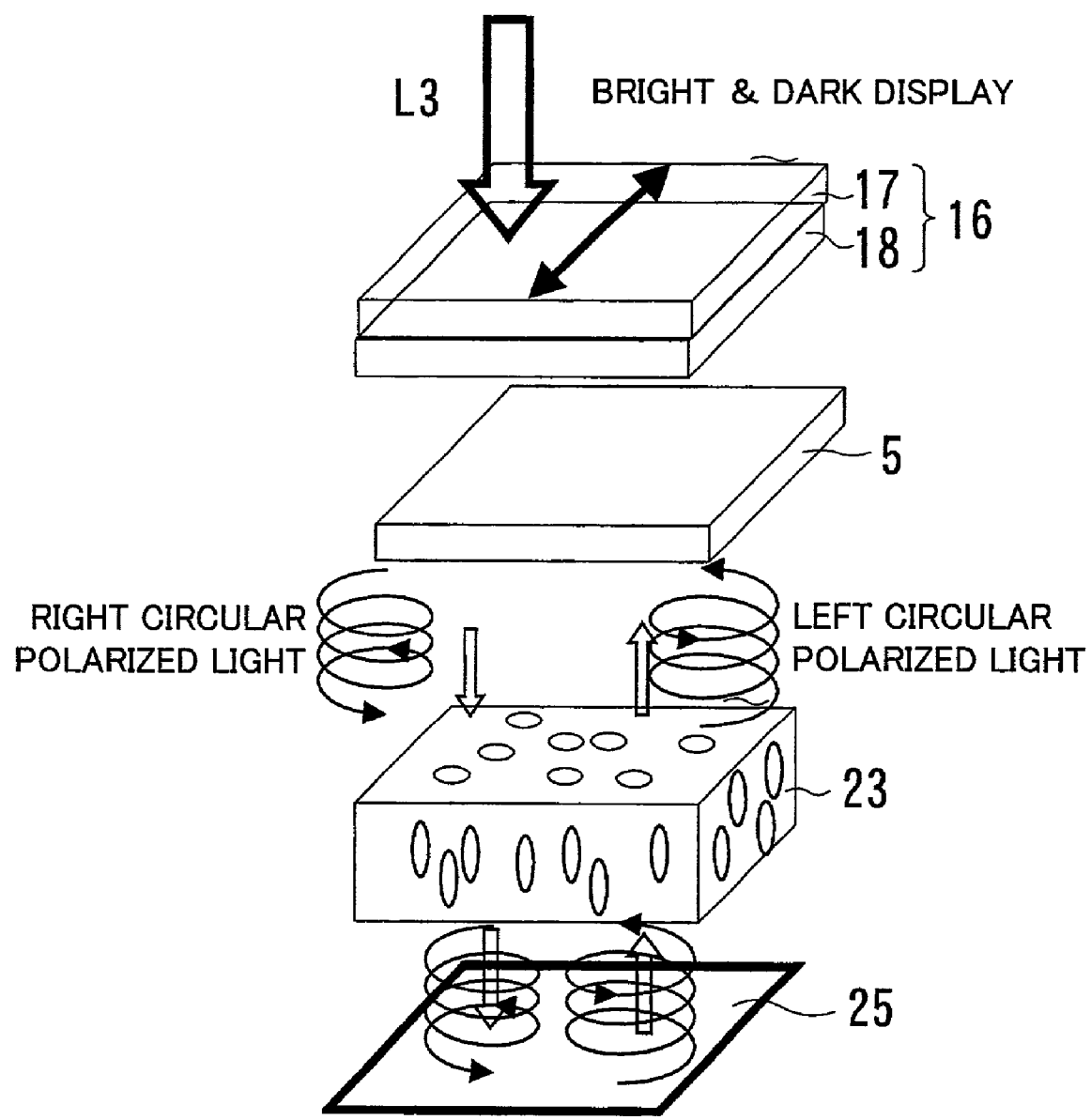
FIG. 6 is an illustration depicting how the display shown in FIG. 1 uses light emitted by the EL element, as well as ambient light, in display operations; the reflective display element is turned off.
Figure 7:
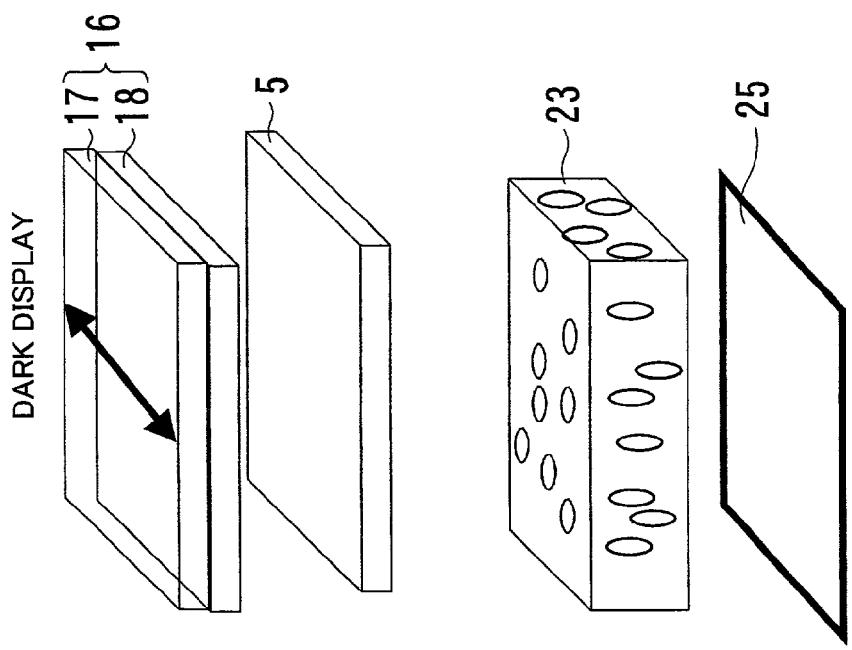
FIG. 7(a) is an illustration depicting how the display shown in FIG. 1 uses light emitted by the EL element to produce a bright screen state, and FIG. 7(b) in a dark screen state; the reflective display element is turned off.
Figure 7:
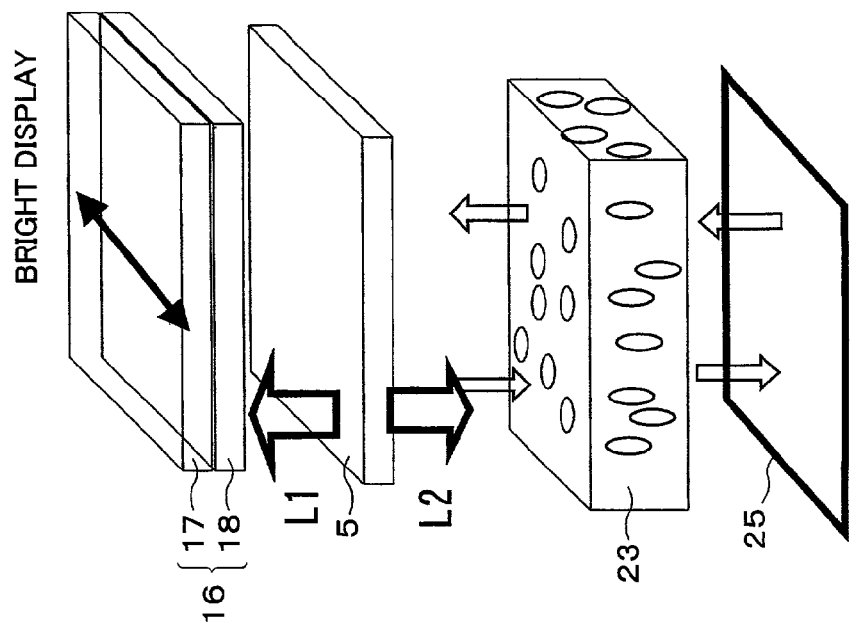

Next, referring to FIGS. 6, 7, the following will describe operations in a case when only the EL element is driven; ambient light and the light emitted by the EL element will be described separately. FIG. 6 shows operations of a reflective display element in such a case on an assumption that the display is always set to a dark state across the whole screen regardless of display data. Ambient light L3 is always absorbed by the circularly polarizing means 16 irrespective of whether the screen is in a bright or dark state, and therefore does not reduce contrast. Meanwhile, the light emitted by the light-emitting layer 5 is non-polarized and remains as such even after passing through the liquid crystal layer 23.

As shown in FIG. 7(a), when in a light-emitting state, both L1 projected to the side facing the observer and L2 projected to the side of reflecting plate are absorbed about by half by the circularly polarizing means 16 as the light passes therethrough. The remaining halves exit the means, achieving a bright screen. Referring to FIG. 7(b), when the EL element does not emit light, the screen naturally appears dark.

Next, referring to FIGS. 8(a), 8(b), the following will describe operations in a case when the EL element and the reflective display element are driven simultaneously. In such a case, ambient light L3 is effectively utilized owing to the workings of the reflective display element as detailed in reference to FIG. 5, and light L1, L2 emitted by the light-emitting layer 5 is also efficiently utilized for displays as detailed in reference to FIG. 7. In other words, in a bright screen state, light emission in addition to ambient light is used; in a dark screen state, there is no reflection of ambient light from the display toward the observer and there is no light emitted, thereby achieving a good dark screen.

The above description referred only to a bright screen state and a dark screen state. The same principles are applicable to half tones as well and produce good halftones.

The EL element 13 in the display 12 is manually or automatically switched on in a bright environment and off in a dark environment. The switching may be done by means of various manual switching devices, light sensors, etc. The EL element 13 constitutes a light source to the reflective display element 14 for displays. The EL element 13 of the present invention includes either simple or active matrix electrodes and is capable of producing a display in accordance with data on its own by controlling the turn-on and -off of each pixel. This is a totally different structure from that of conventional frontlights which were mere light-guiding plates which only could be turned on/off across the entire screen.

As described here, the present invention offers a thin, lightweight display which operates in three display modes depending on the condition of ambient light: the reflective display element is driven alone in one mode, the EL element is driven in another, and both elements are simultaneously driven in the third.

Embodiment 2

Figure 9:
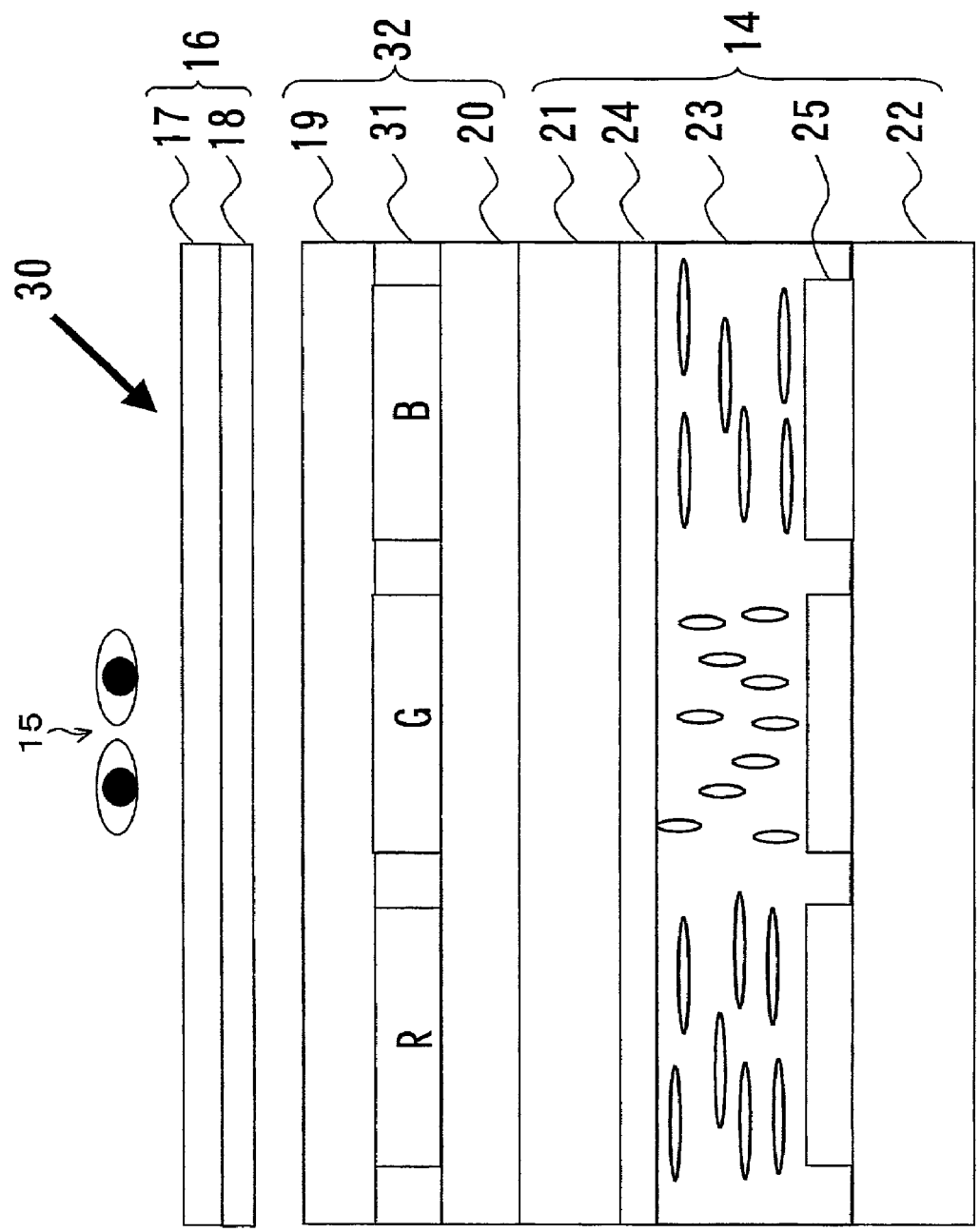
FIG. 9 is a schematic cross-sectional view of a second embodiment of a display in accordance with the present invention.

FIG. 9 shows another display in accordance with the present invention having a structure which is capable of displaying full colors when the EL element 32 is powered on, owing to the formation of RGB light emission patterns in the light-emitting layer 31 in the EL element 32. There is no change in the rest of the basic structure from embodiment 1.

The light-emitting layer 31 is formed, as an example, as follows: fabricate a body composed of a red-light-emitting organic layer and an electrode stacked thereon by vacuum vapor deposition. Move the mask parallel and stack a green-light-emitting organic layer on the electrode by vacuum vapor deposition. Finally, move the mask further parallel and stack a blue light-emitting organic layer on the electrode.

A concrete example is now given of the formation method of the light-emitting layer 31. The organic layer providing green light emission is formed by vapor-depositing, as a hole transfer layer, N,N -diphenyl-N,N'-bis(3-methylphenyl)1,1'-biphenyl-4,4'-diamine (hereinafter, simply referred to as TPD) in vacuum of $1.33 \times 10^{-4}$ Pa ($10^{-6}$ Torr) at an evaporation ratio of 0.2–0.4 nm/s by resistance heating up to a thickness of 20 nm, with a vapor deposition mask with openings corresponding to a required film pattern being interposed between a glass substrate and a vapor supply. On the top of it, tris(8-hydroxyn quinoline) aluminum (hereinafter, simply referred to as Alq3), which will play a dual role of electron transfer and light emission, is vapor deposited in vacuum at an evaporation ratio of 0.2–0.4 nm/s by resistance heating up to a thickness of 40 nm to form an electron transfer layer.

Red light emission is realized by, for example, including in Alq3, an electron transferring material, a red-light-emitting pigment, for example, 4-dicyanomethylene-6-(p-dimethylaminostyril)-2-methyl-4-Hpyrane (hereinafter, will be simply referred to as DCM), Nile red, or a perylenediimide derivative. Blue light emission is realized by, for example, using a fluorescent-blue-light-emitting material as a hole transfer material and stack on an electron transfer material.

The metal electrode acting as the cathode is made of a Mg—Ag (30:1) metal alloy with a 10 nm thickness to ensure light transmission. If the resistance is too high to achieve normal operation, an ITO film may be deposited. Besides mask vapor deposition employed here, the RGB patterning method may be done by ink jet scheme or thermal transfer.

This way, the RGB-light-emitting layer 31 is fabricated and the EL element 32 is obtained. The structure enables full color displays when voltage is applied to the EL element to cause it emit light. Meanwhile, if no voltage is applied to the EL element, the reflective display element is capable of producing good black & white displays. In either case, ambient light is no longer a cause for contrast fall, and good display characteristics become available. The contrast was 100 when the light-emitting layer 31 was driven alone, 20 when the reflective display element 14 was driven alone, and 80 when both were driven simultaneously. In addition, in the display 30 of the present embodiment, the reflective film 25 is formed on the side of the liquid crystal layer 23, and a parallax-free, fine display was obtained.

Embodiment 3

Figure 10:
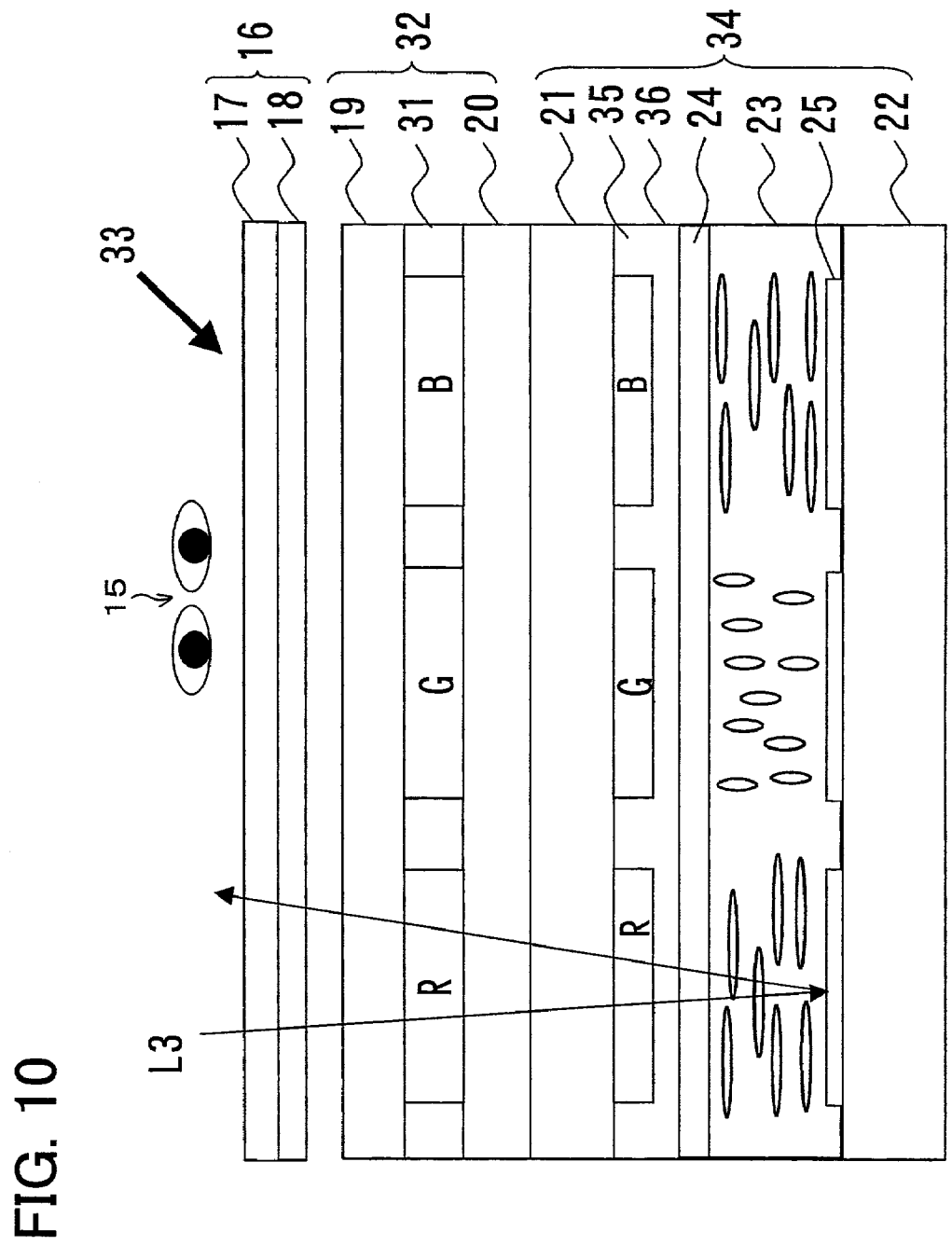
FIG. 10 is a schematic cross-sectional view of a third embodiment of a display in accordance with the present invention.

FIG. 10 shows another display in accordance with the present invention having a structure, enabling full color displays in either of the aforementioned display schemes, in which RGB light-emitting patterns are formed in the light-emitting layer 31 in the EL element 32 and a color filter layer 35 is formed on the transparent substrate 21 in the reflective display element 34. There is no change in the rest of the basic structure from embodiment 2.

In the figure, the display 33 has an almost identical structure to that of the display 30 of embodiment 2, but is characterized by the formation on the glass substrate 21 of a color filter layer 35 of a colorant dispersion scheme which is transparent to red, green, and blue light. The color filter layer 35 includes red, green, and blue-colored filters, arranged in stripes, which correspond to individual pixels in a single picture element. On the top of the color filter layer 35 is there provided a flattening film 36 and a transparent electrode 24 further thereon to form a display electrode.

In the present embodiment, the color filter layer 35 is formed by colorant dispersion as follows. First, a photosensitive coloring resist composed of a transparent photosensitive resin containing uniformly dispersed red colorant is applied on the glass substrate 21. In the present embodiment, CR2000, a product of Fujifilm Olin Co. Ltd. was applied up to a thickness of 2.0 µm by spin coating at 650 revolutions as an example. The substrate coated with resist is then prebaked at 80° C. and developed by lithography using a predetermined mask, and finally baked at 220° C. for 30 minutes, to form a red pattern. The same process is used to form green and blue patterns from CG2000 and CB2000 respective, both available from Fujifilm Olin Co. Ltd., which completes the fabrication of the color filter layer 35. A black matrix may be formed from CK2000, black resist available from the same company, interlacing with the red, green, and blue filter patterns.

The filters' color design is very important in the device structure. A factor that should be considered in determining the saturation of a color filter layer in a reflective display element, like the layer 35 in the present embodiment, is the fact that incident ambient light L3 travels through the color filter layer twice, once in the incoming leg and again in the outgoing leg, before exiting the layer as shown in FIG. 10. Further, the color filter may be prepared not necessarily by colorant dispersion; electrocoating offers an alternative method. The color filter may be formed not necessarily on the substrate 21, but on the substrate 19 or 20 disposed closer to the EL element. Also, the color filter may be located in direct contact with the light-emitting layer 31, in which instance the anode of the light-emitting layer may be used as an electrode for use in the formation of an electrocoated color filter. In short, the color filter may be formed anywhere behind the circularly polarizing means 16.

In the present embodiment, the provision of the RBG light-emitting layers in the EL element and the color filter layer 35 in the reflective display element 34 enables a full color display or a multiple color display with a wide color reproduction range. In the structure introduced in the embodiment, increased color purity and efficiency are achieved as a result of matching the peak wavelengths of the light-emission characteristics of the light-emitting layer 31 and those of the characteristics of the color filter layer 35.

Embodiment 4

Figure 11:
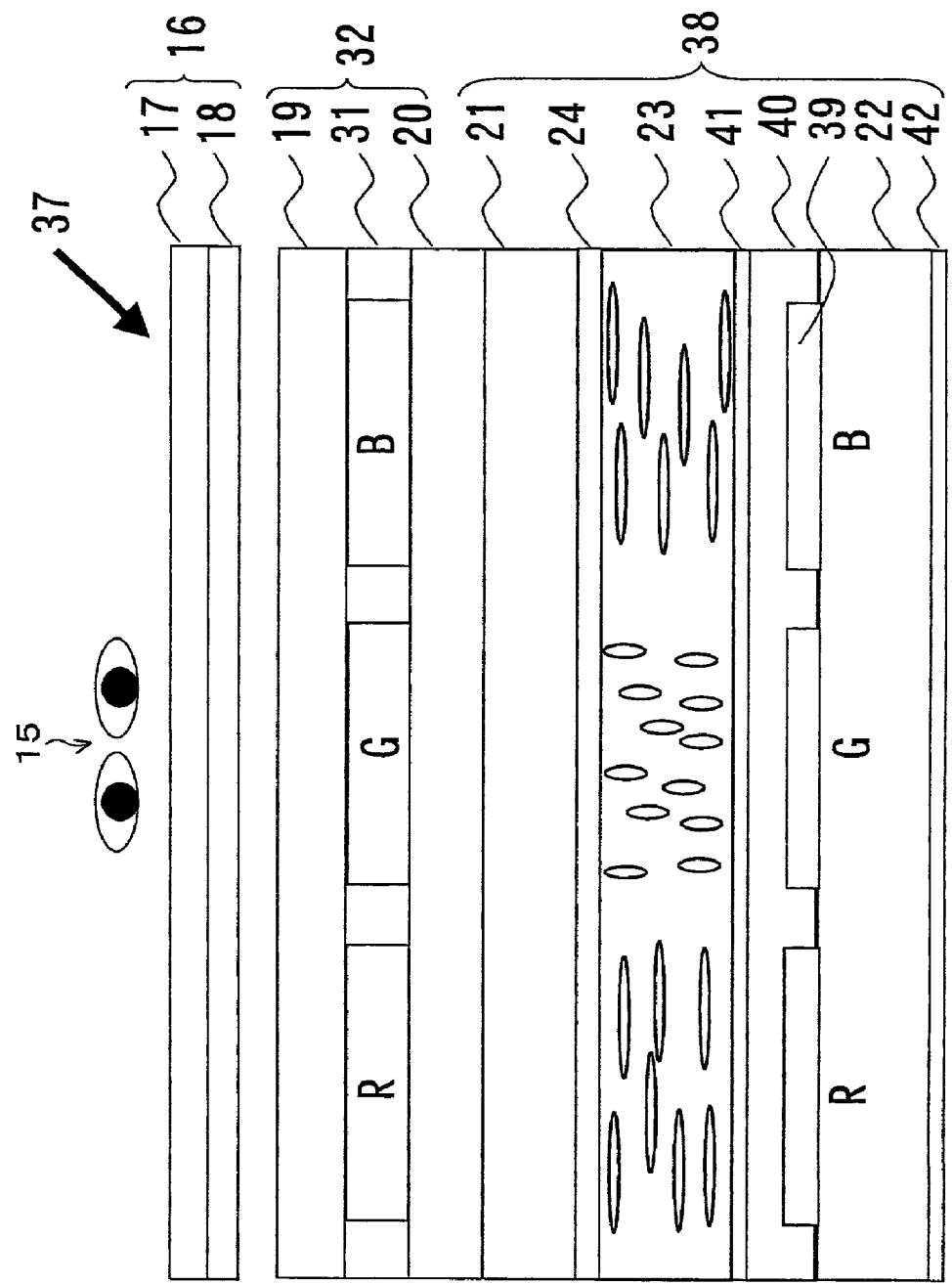
FIG. 11 is a schematic cross-sectional view of a fourth embodiment of a display in accordance with the present invention.

FIG. 11 shows another display in accordance with the present invention having a structure, enabling full color displays in either of the aforementioned display schemes, in which RGB light-emitting patterns are formed in the light-emitting layer 31 in an EL element 32 and a reflective color filter layer 39 is formed on a transparent substrate 21 in a reflective display element 38. There is no change in the rest of the basic structure from embodiment 3.

In the figure, there is provided a flattening layer 40 on the reflective color filter layer 39 and a ITO transparent electrode 41 on the layer 40. Behind the reflective color filter layer 39 is there provided a light-absorbing layer 42.

The reflective type of color filter may be an organic volume hologram, optical color filter, or inorganic dichroic mirror if there is provided a light-absorbing layer behind the color filter. The light-absorbing layer may be provided in direct contact with the reflective color filter, behind the transparent substrate 22 as in the present embodiment, or anywhere else behind the reflective color filter.

A thin, lightweight display 37 is hence fabricated which includes the EL element 32 capable of (i) presenting information by self-emission at night and in other dark environments and (ii) likewise presenting information and also doubling as a light source for the reflective display element 38 during daytime and other times when the reflective display element 38 must rely on external light to present information.

Embodiment 5

Figure 12:
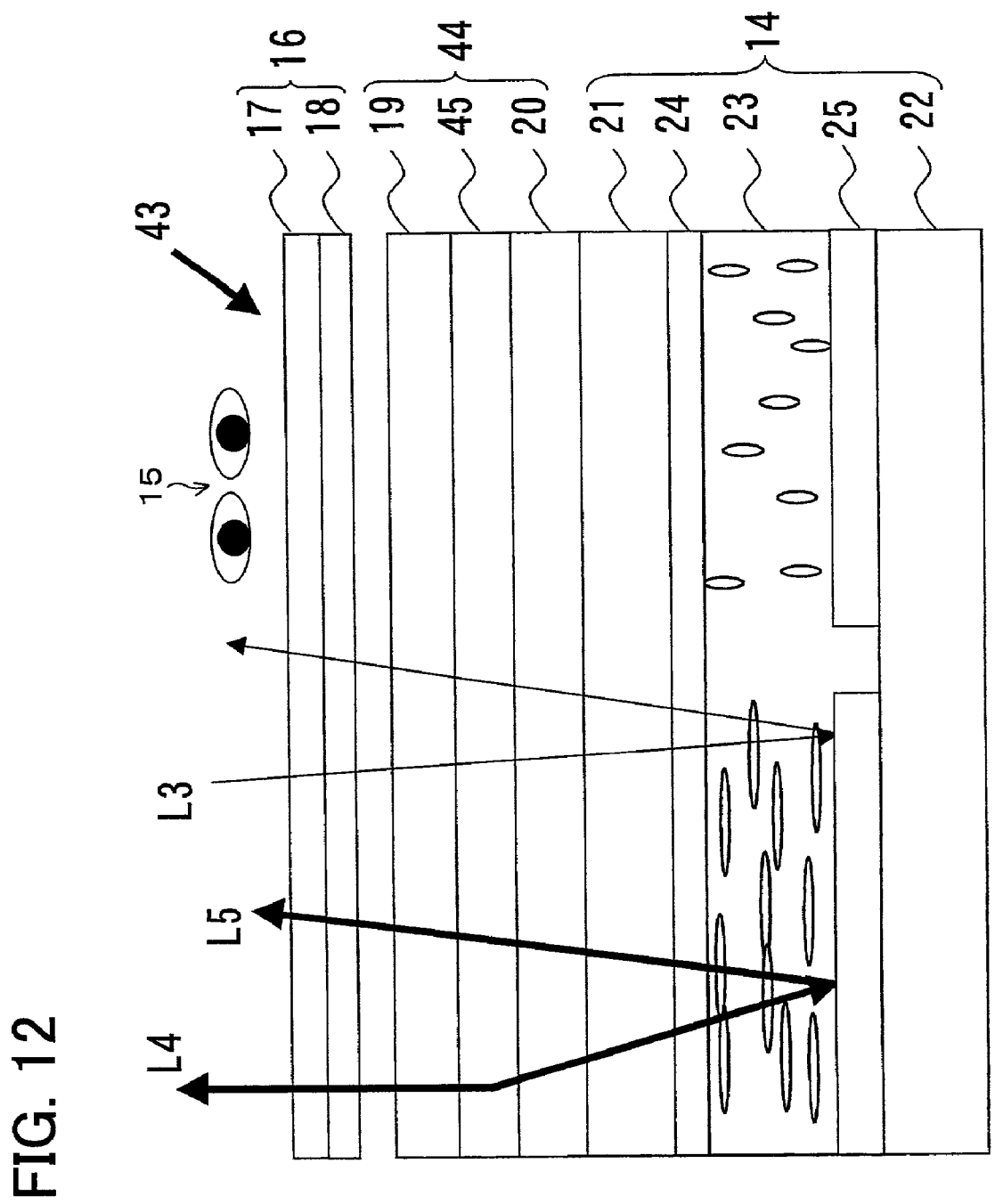
FIG. 12 is a schematic cross-sectional view of a fifth embodiment of a display in accordance with the present invention.

FIG. 12 shows another display 43 in accordance with the present invention employing a circularly polarized-light-emitting layer 45 as an EL element 44. There is no change in the rest of the basic structure from embodiment 3. The circularly polarized-light-emitting layer 45 emits right circularly polarized light L4, L5. Whether the light is emitted with right or left circular polarization is controllable by composition and treatment: in the present embodiment, the layer 45 is adapted to emit right circularly polarized light.

The following will describe a method of fabricating a circularly polarized light-emitting layer. Poly{2,5-bis[(S)-2-methylbutoxy]-1,4-phenylene}vinylene}-co-{[2,5-bis[(3R,3S)-(3,7-dimethyloctyl)oxy]-1,4-phenylene]vinylene} is prepared by synthesis as circularly polarized-light-emitting material. This is blended with a 7:1 mixed solution of chloroform and 0-dichlorobenzene at a ratio of 4 mg/mL. The resultant mixture is applied by spin coating under a nitrogen atmosphere onto a 10 nm (1000 Å) thick ITO film formed by sputtering on a glass substrate. The substrate is then prebaked at 60° C. so as to make the solvent evaporate. An aluminum electrode is formed on the remaining by vapor deposition.

Applying a 20-V voltage using the ITO side of the element as an anode and the aluminum side thereof as a cathode produced "g" equal to $-1.1 \times 10^{-1}$ for 600-nm-wavelength light emission. Here, g was defined as $$g = 2(I_L - I_R)/(I_L + I_R)$$

where $I_R$ is the intensity of right circularly polarized light and $I_L$ is the intensity of left circularly polarized light.

Normalizing the intensity of light at a 600 nm wavelength as unity, the value of g gives $I_L = 0.47$ and $I_R = 0.53$, which verifies the circular polarization of the emitted light.

Figure 13:
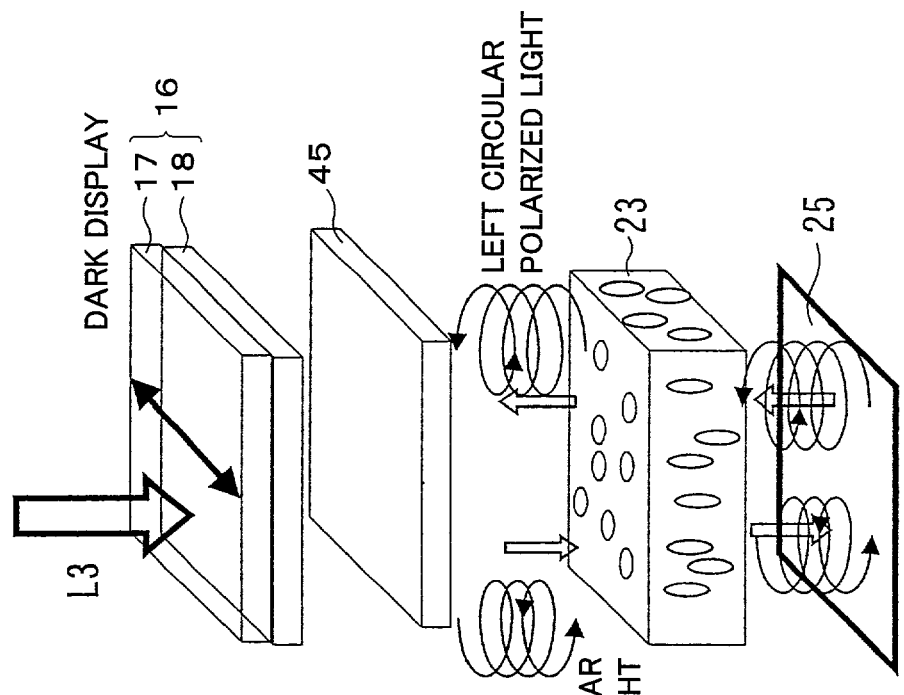
FIG. 13(a) is an illustration depicting how the display shown in FIG. 12 which utilizes polarized light emission produce a bright screen state, and FIG. 13(b) in a dark screen state.
Figure 13:
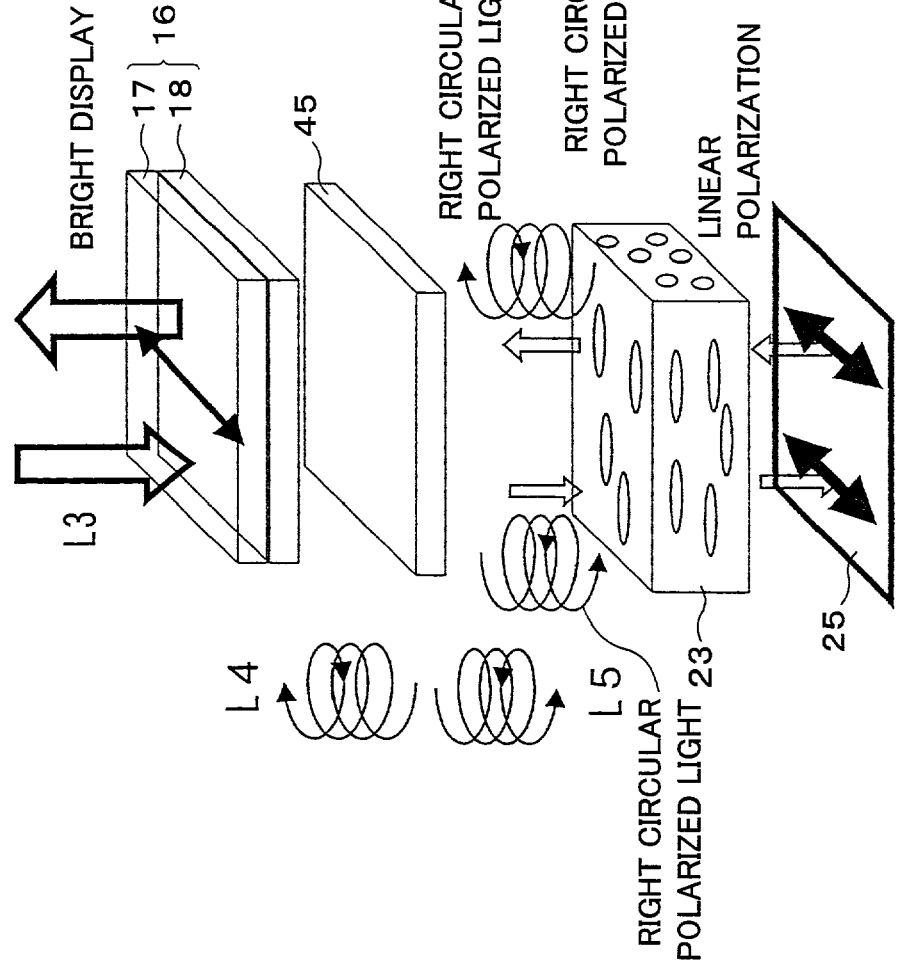

Referring to FIGS. 13(a), 13(b), we will discuss how efficiently the light is utilized for displays. The circularly polarizing means 16 is adapted to impart right circular polarization to incident light. Ambient light L3 becomes right circularly polarized as it passes through the circularly polarizing means 16 before entering the liquid crystal layer 23.

Under these circumstances, the circularly polarized-light-emitting layer 45 emits right circularly polarized light L4, L5. Therefore, the liquid crystal layer 23 receives a combination of the externally originating, now right circularly polarized light L3 and the circularly polarized light L5 emitted by the circularly polarized-light-emitting layer 45. A twisted liquid crystal layer changes the polarization of light from right circular to linear, so the combined light is linearly polarized when reaching the reflective film 25. The reflection travels through the twisted liquid crystal layer and the quarter-wave plate 18 and becomes linearly polarized on the same plane of polarization as the incident light. The linearly polarized light passes through the polarizing plate 17 without experiencing any changes, producing a bright screen. Meanwhile, L4, emitted from the side facing the observer, is right circularly polarized and transmitted as such through the circularly polarizing means 16, producing a bright screen.

This emission of polarized light doubles the amount of light coming out of the display, when compared to the emission of non-polarized light and achieves a good bright state. When the polarized-light-emitting layer 45 does not emit light, a good dark state is realized as in embodiment 1. As shown in the description above, arranging the display 43 based on the circularly polarized-light-emitting layer 45 satisfying the requirement g≠0 results in better efficiency in directing emitted light out of the device.

Embodiment 6

Figure 14:
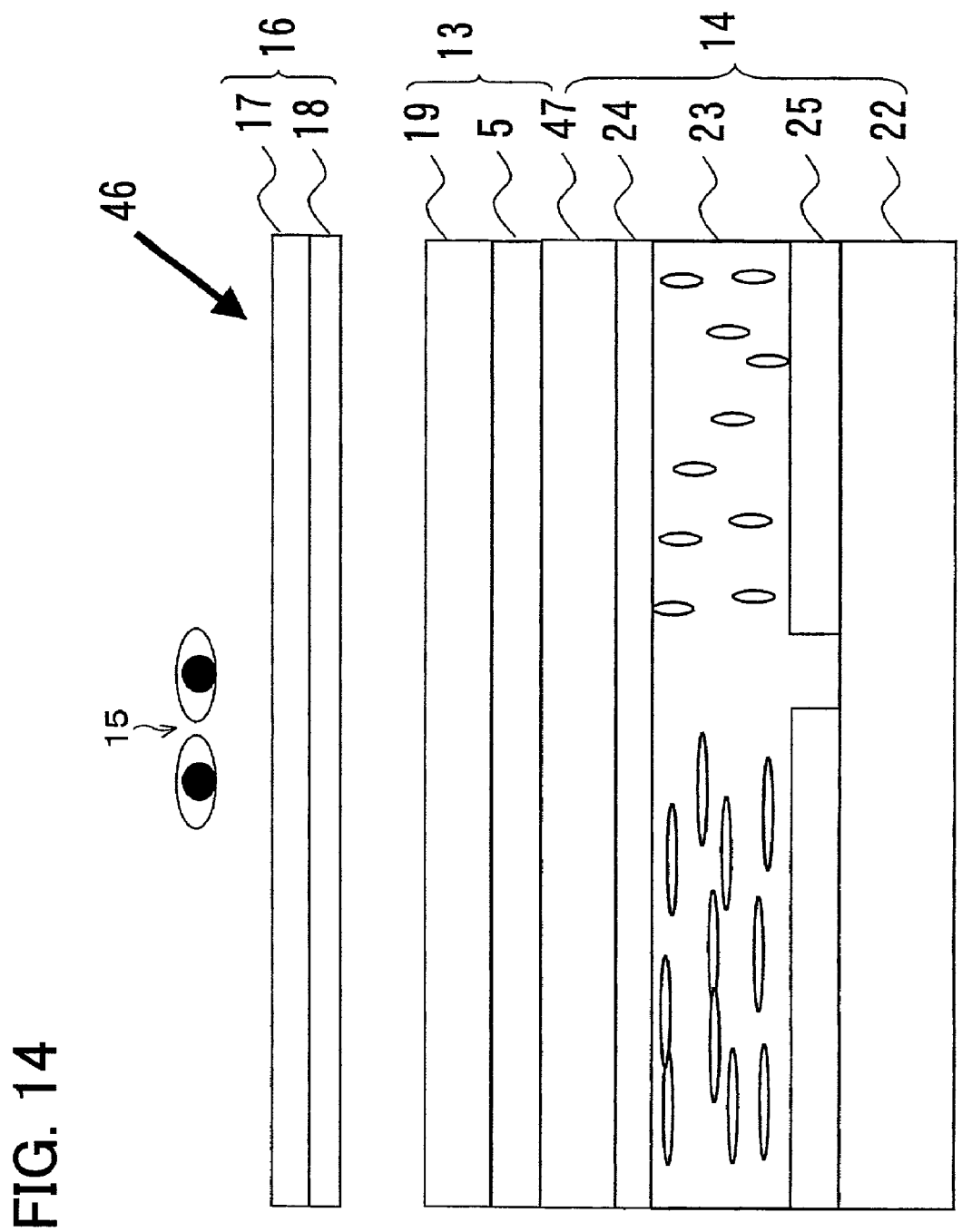
FIG. 14 is a schematic cross-sectional view of a sixth embodiment of a display in accordance with the present invention.

FIG. 14 shows another display 46 in accordance with the present invention in which a transparent substrate coating the light-emitting layer 5 in the EL element 13 and a front transparent substrate of the reflective display element 14 is integrated into a single substrate 47. There is no change in the rest of the basic structure from embodiment 1. The structure reduces the thickness and weight further.

Embodiment 7

Figure 15:
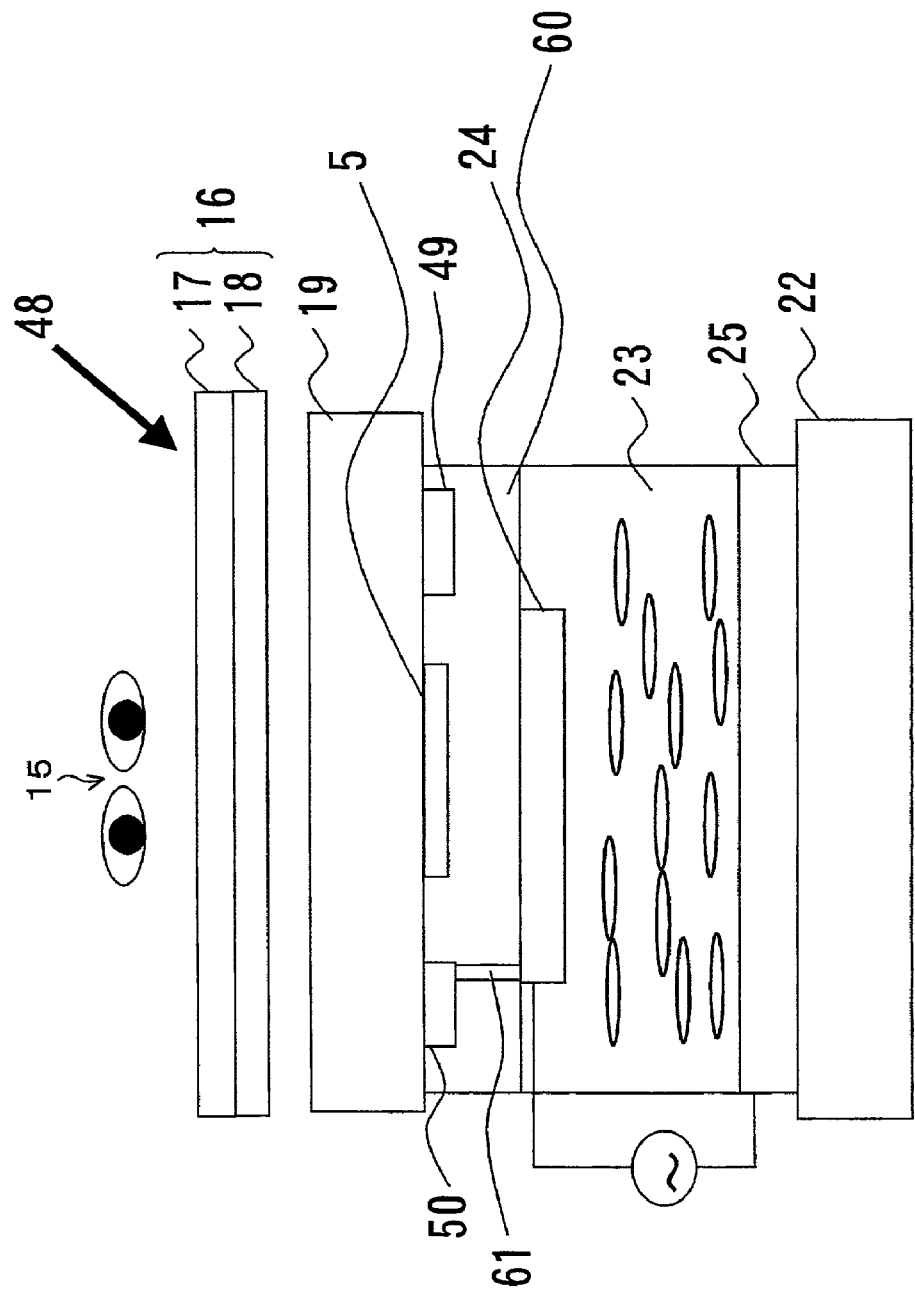
FIG. 15 is a schematic cross-sectional view of a seventh embodiment of a display in accordance with the present invention.

FIG. 15 shows another display 48 in accordance with the present invention in which the light-emitting layer 5, a part of the EL element, and the transparent electrode 24 for driving the liquid crystal layer 23 are formed on the same transparent substrate 19. The structure involves only two substrates, further reducing the thickness and weight. FIG. 15 is an enlarged cross-sectional view illustrating a single pixel.

An active element 49 controlling the light-emitting layer 5 and another active element 50 controlling the liquid crystal layer 23 are provided on the transparent substrate 19. A transparent protection film 60 is formed on the active elements 49, 50. A contact hole 61 is provided in which the active element 50 is connected to the transparent electrode 24 driving the liquid crystal. The active elements may be a 3-terminal element typically exemplified by a TFT (thin film transistor) or a 2-terminal active matrix element typically exemplified by an MIM (metal-insulator-metal) structure.

In this structure, the reflective electrode 25, one of liquid-crystal-driving electrodes, and the cathode, one of light-emitting-layer-driving electrodes, are provided as separate entities, which allows various modifications to the reflective electrode 25: to name a few examples, an undulating film may be formed as detailed in embodiment 1 and a reflective color filter may be applied as detailed in embodiment 4.

Embodiment 8

The circularly polarizing means 16 constructed as shown in FIG. 1 may include a polarizing plate 17 and wave plates so as to produce circularly polarized light in a broader bandwidth. In the present embodiment, two or three wave plates are used to further enhance contrast.

Figure 16:
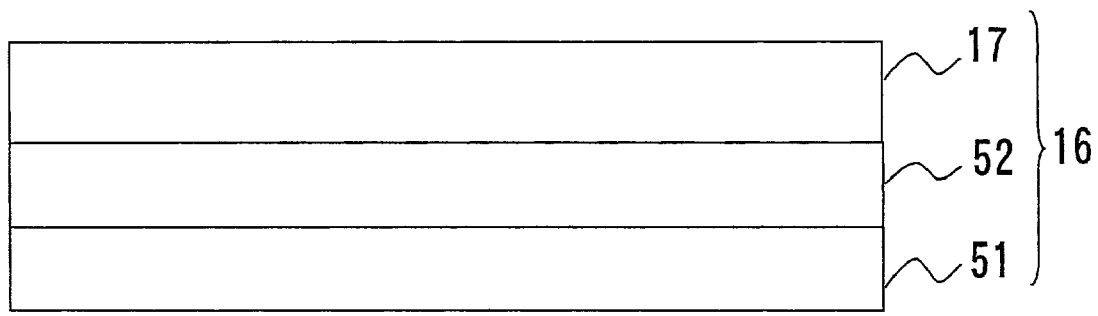
FIG. 16 is a cross-sectional view of another further embodiment of a display in accordance with the present invention in which there is provided circularly polarizing means having two optical phase difference compensating plates.
Figure 17:
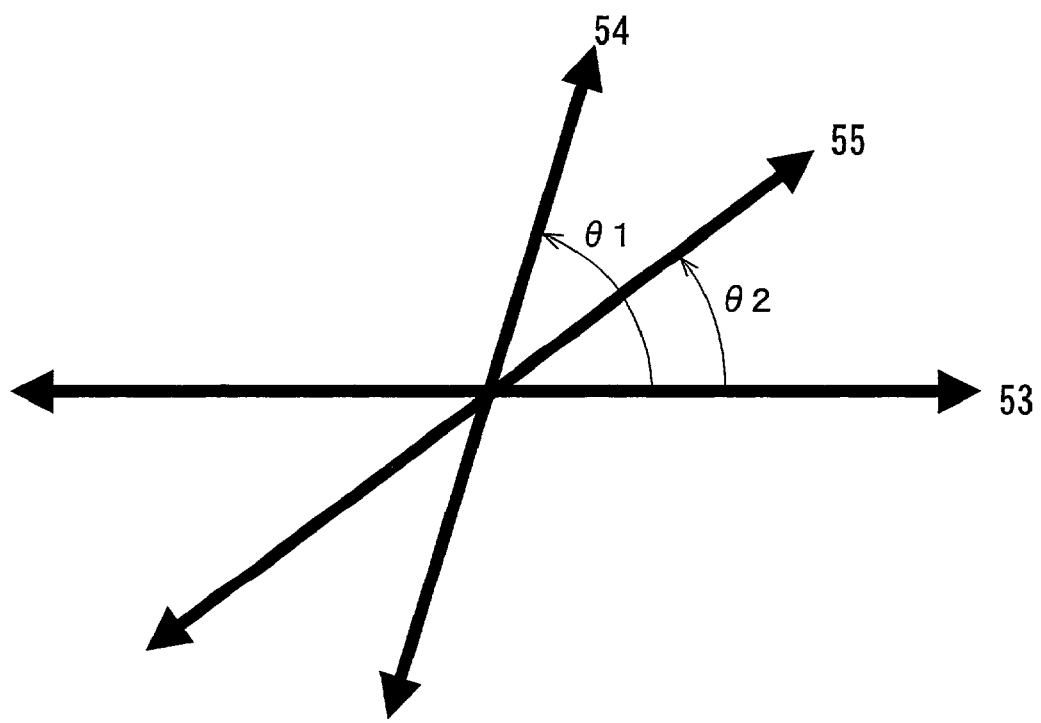
FIG. 17 is a drawing showing the specified directions for the polarizing plate and the optical phase difference compensating plate in the circularly polarizing means in FIG. 16.

FIGS. 16–19 show the structure specifically. FIG. 16 depicts a first optical phase difference compensating plate 51 and a second optical phase difference compensating plate 52 positioned so as to produce phase differences of 135 nm and 270 nm respectively, when viewed in the same direction as incoming light. Referring to FIG. 17, supposing that the two plates are arranged so that θ1=75° and θ2=15°, where θ1 is the angle between the direction 53 of the transmission axis of the polarizing plate and the direction 54 of the retardation axis of the first optical phase difference compensating plate and θ2 is the angle between the direction 53 of the transmission axis of the polarizing plate and the direction 55 of the retardation axis of the second optical phase difference compensating plate, incident light to the display travels through the polarizing plate 17 and the optical phase difference compensating plates 52, 51 and becomes substantially right circularly polarized at visual light wavelengths.

In other words, the circularly polarizing means 16 includes: the first optical phase difference compensating plate 51 adapted to produce a retardation of not less than 100 nm and not more than 180 nm in a normal direction to the substrate; the second optical phase difference compensating plate 52 adapted to produce a retardation of not less than 200 nm and not more than 360 nm in a normal direction to the substrate; and a linearly polarizing plate (polarizing plate 17), the three plates being positioned in this order when viewed from the EL element 13. Further, the linearly polarizing plate (polarizing plate 17) and the optical phase difference compensating plates 51, 52 are positioned so as to satisfy the equation:

$$35° \leq |2 \times \theta_2 - \theta_1| \leq 55°$$

where θ1 is the angle between either the transmission or absorption axis of the linearly polarizing plate and the retardation axis of the first optical phase difference compensating plate 51 and θ2 is the angle between either the transmission or absorption axis of the linearly polarizing plate and the retardation axis of the second optical phase difference compensating plate 52.

Figure 18:
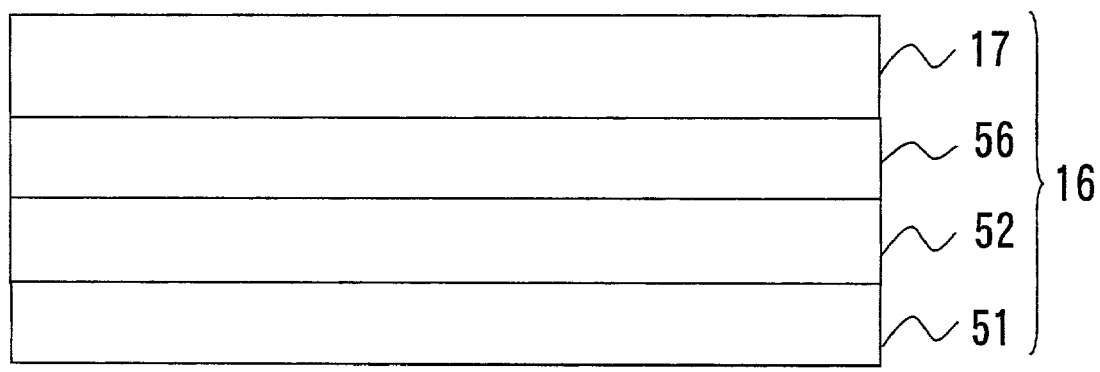
FIG. 18 is a cross-sectional view of a further embodiment of a display in accordance with the present invention in which there is provided circularly polarizing means having three optical phase difference compensating plates.
Figure 19:
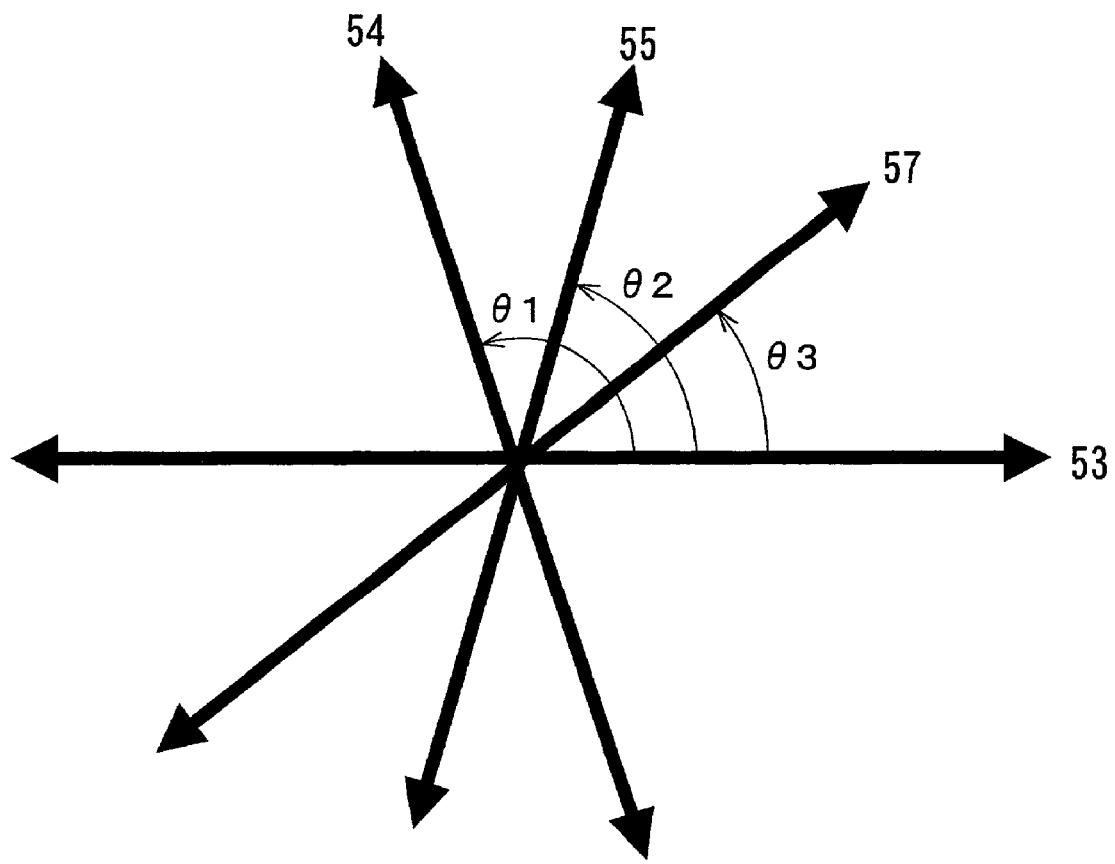
FIG. 19 is a drawing showing the specified directions for the polarizing plate and the optical phase difference compensating plate in the circularly polarizing means in FIG. 18.

FIG. 18 depicts a structure of a circularly polarizing plate composed of three optical phase difference compensating plates, e.g., a first optical phase difference compensating plate 51, a second optical phase difference compensating plate 52, and a third optical phase difference compensating plate 56, positioned so as to produce phase differences of 135 nm, 270 nm, and 270 nm respectively. Referring to FIG. 19, supposing that the three plates are arranged so that θ1 =100.2°, θ2=34.2°, and θ3=6.5°, where θ1 is the angle between the direction 53 of the transmission axis of the polarizing plate and the direction 54 of the retardation axis of the first optical phase difference compensating plate, θ2 is the angle between the direction 53 of the transmission axis of the polarizing plate and the direction 55 of the retardation axis of the second optical phase difference compensating plate, and θ3 is the angle between the direction 53 of the transmission axis of the polarizing plate and the direction 57 of the retardation axis of the third optical phase difference compensating plate, incident light to the display travels through the polarizing plate 17 and the optical phase difference compensating plates 56, 52, 51 and becomes circularly polarized at a wide range of wavelengths when compared to the use of two optical phase difference compensating plates.

In other words, the circularly polarizing means 16 includes: the first optical phase difference compensating plate 51 adapted to produce a retardation of not less than 100 nm and not more than 180 nm in a normal direction to the substrate of that optical phase difference compensating plate; the second optical phase difference compensating plate 52, provided on the first optical phase difference compensating plate 51, adapted to produce a retardation of not less than 200 nm and not more than 360 nm in a normal direction to the substrate; the third optical phase difference compensating plate 56, provided on the second optical phase difference compensating plate 52, adapted to produce a retardation of not less than 200 nm and not more than 360 nm in a normal direction to the substrate; and the polarizing plate 17 provided on the third optical phase difference compensating plate 56, as viewed from the EL element 13. Further, the polarizing plate 17 and the optical phase difference compensating plates 51, 52, 56 are positioned so as to satisfy the equation:

$$35° \leq |2 \times \theta 3 - \theta 2 - \theta 1| \leq 55°$$

where θ1, θ2, and θ3 are the angles between either the transmission or absorption axis of the polarizing plate 17 and the retardation axes of the first, second, and third optical phase difference compensating plates 51, 52, 56 respectively.

In the embodiments described so far, the optical phase difference compensating plate was a uniaxial oriented film; alternatively, phase difference films prepared from a biaxial (e.g., having an index of refraction controllable in three dimensions) phase difference film or a liquid crystal polymer. These alternatives gives wider viewing angles.

Embodiment 9

Figure 20:
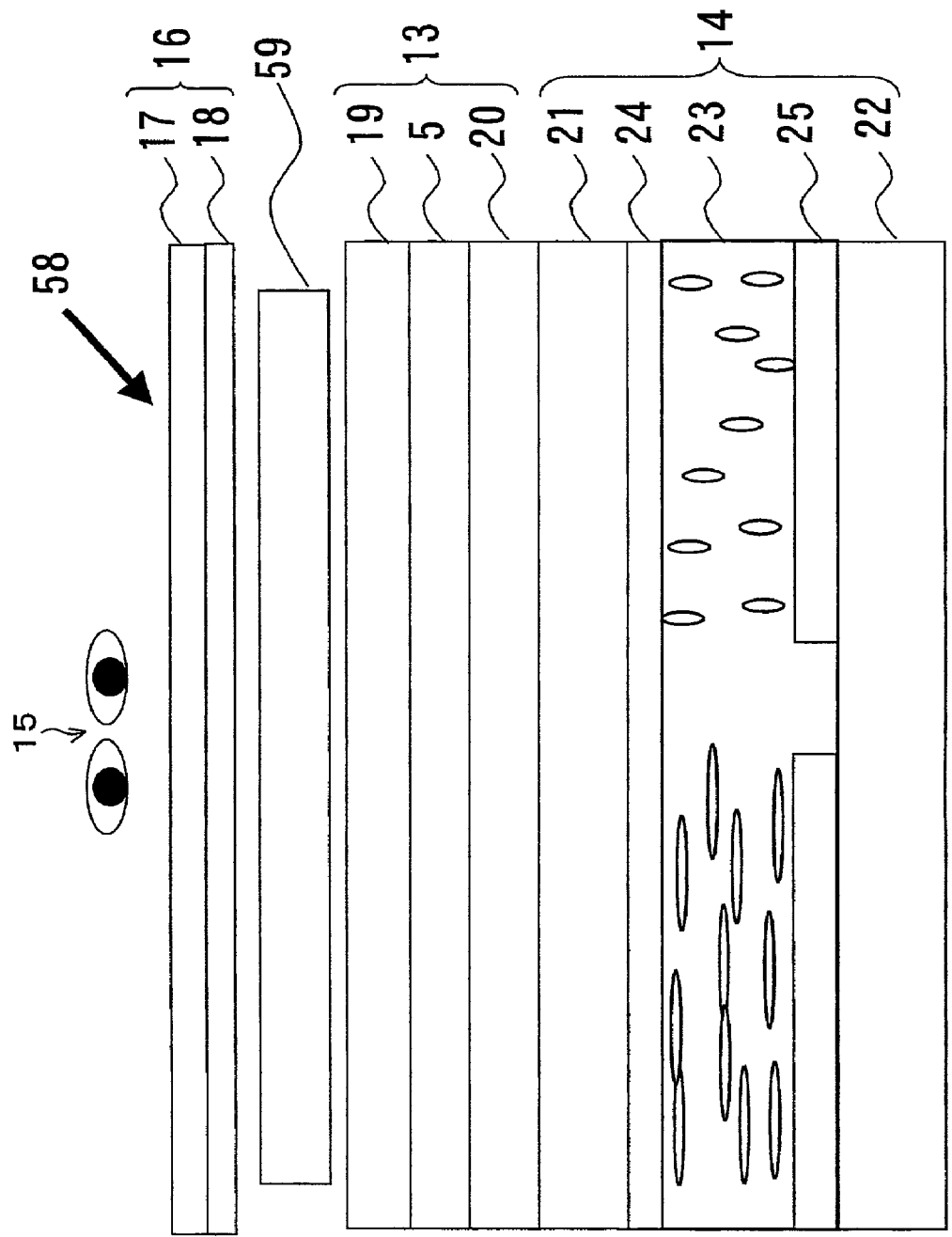
FIG. 20 is a cross-sectional view showing a construction of a display in accordance with the present invention in which there is provided a touch panel on the back of circularly polarizing means.
Figure 21:
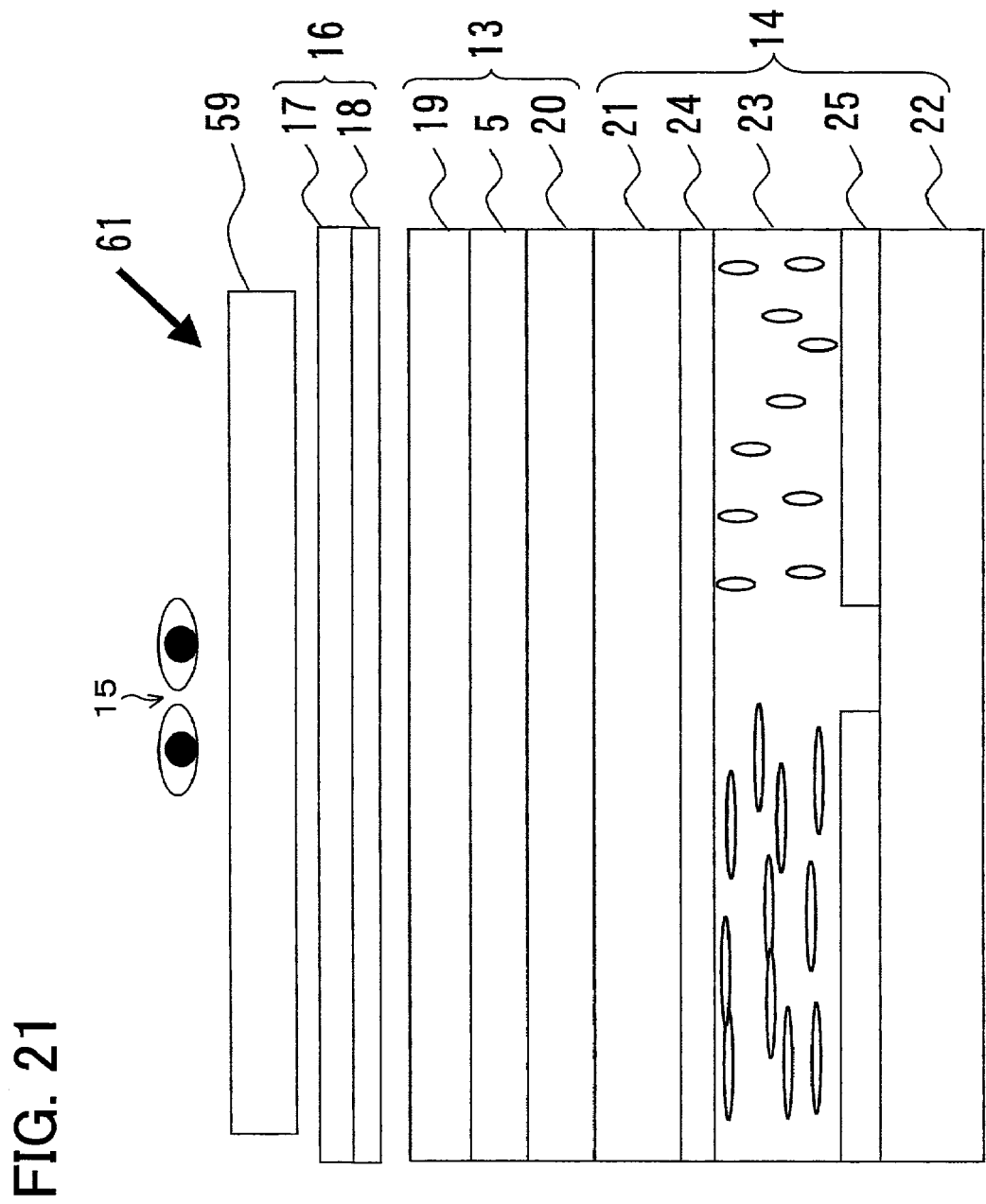
FIG. 21 is a cross-sectional view showing a construction of a conventional display in which there is provided a touch panel in front of the display.

FIG. 20 shows a display 58 provided on the back of the circularly polarizing means 16 with a touch panel (pressure-sensitive coordinates-detecting input device) 59 as data input means incorporated in portable devices which are the principal applications of the displays of the present invention. For comparison, FIG. 21 shows a conventional arrangement 61 in which a touch panel 59 is positioned on the side facing the observer of the display.

In the conventional arrangement 61, the reflection from the touch panel was directly visible to the observer, which resulted in great losses in visibility. The reflection was caused not only from a gap between transparent electrodes for pressure-applying-position detection, but also from a gap between a touch-panel-supporting substrate and a polarizing plate 17. In contrast, the arrangement 58 of the present embodiment caused no visible reflection, producing excellent quality displays as if no touch panel had been used at all. No reflection was observed which was due to the gap between the transparent electrodes for pressure-applying-position detecting in the touch panel, a pressure-delivery prevention gap, or an interface between the touch-panel-supporting substrate and a substrate 19 in the EL element. These results prove that the display with an integrated input device of the present embodiment is capable of utilizing circular polarization of light for displaying purposes effectively.

The present invention has been so far described by way of embodiments, which is not meant to restrict the invention in any fashion. The present invention may vary greatly within the spirit and scope of the invention.

The EL element may be powered by a combination of a solar cell and a rechargeable battery. The EL element may be an inorganic EL display or a light-emitting diode.

The organic EL element is not limited to those used in the foregoing embodiments: other kinds of organic EL elements may be used for different combinations. The embodiments above were described assuming the use of a liquid crystal element; alternatively, an inorganic, birefringence modulating layer with a photoelectric conversion function may be applied. For example, the liquid crystal layer 23 may be replaced with PLZT, another kind of photoelectric element. PLZT is a transparent, birefringent photoelectric ceramics. PLZT is a ferroelectric transparent material which is expressed by the general formula:

$(Pb_{1-x}La_x)(Zr_{1-y}Ti_y)_{1-x/4}O_3 (0 < x \leq 0.3, 0 < y \leq 1.0)$ and can be described as being lead zirconate titanate doped with lanthanum. The material exhibits variable optical properties (Δnc) depending on the composition which are controllable with an electric field.

The EL element may illuminate only a part of the display screen. The function may be useful to, for example, produce high brightness for an aminated image display on a part of the screen and easy-to-see brightness for a text-based display on the rest of the screen, by raising the light intensity created by the EL element for that part of the screen. Graphics- and text-based displays have different optimum brightness levels for easy recognition. In conventional technology, the brightness was difficult to adjust in parts of the screen depending on displayed contents.

Embodiment 10

Figure 22:
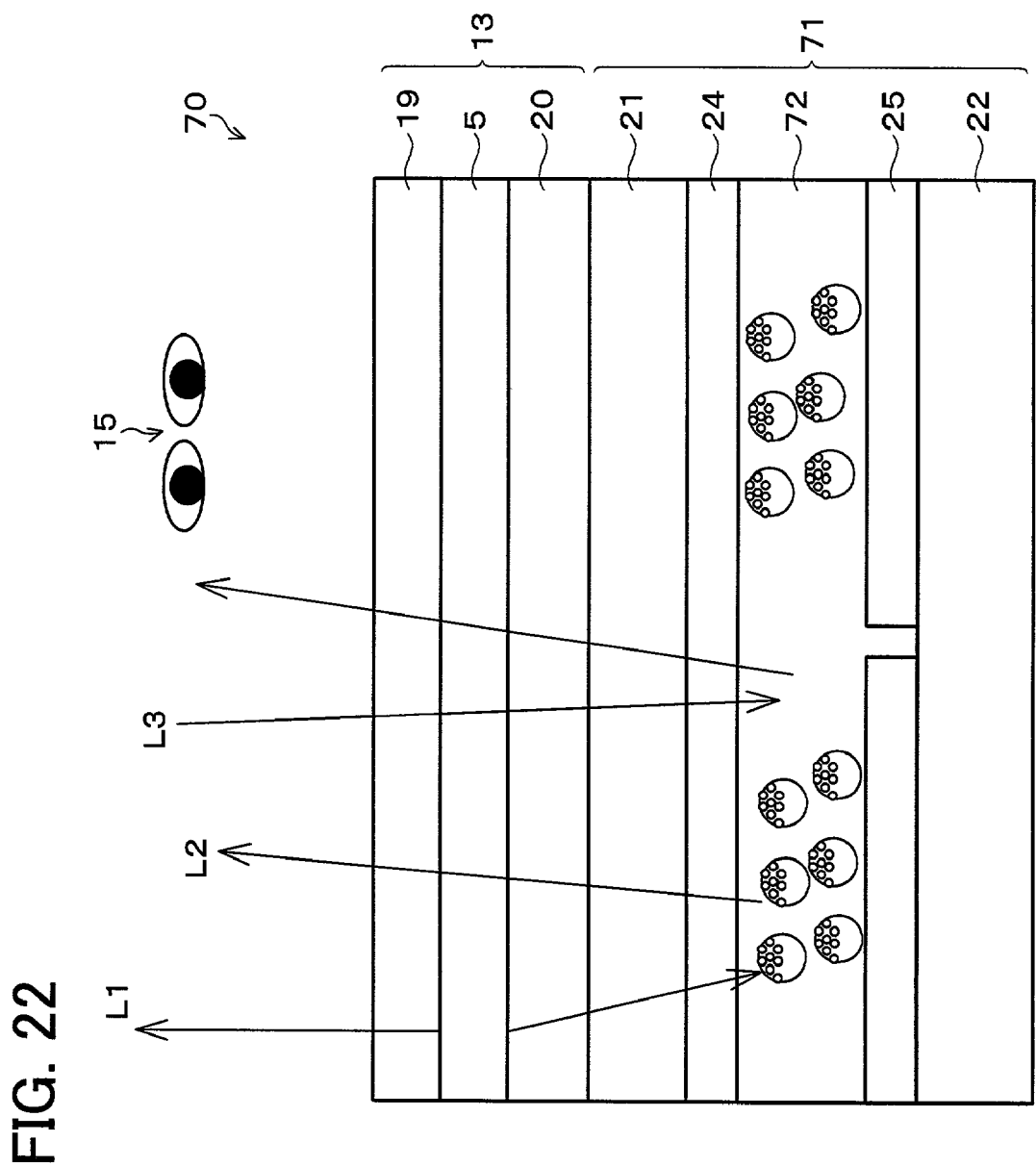
FIG. 22 is a schematic cross-sectional view of still another embodiment of a display in accordance with the present invention.

Another embodiment in accordance with the present invention will be described in reference to FIGS. 22, 23. FIG. 22 schematically shows a display 70 of embodiment 10 in accordance with the present invention. The EL element 13 in the figure may have, for example, the structure shown in detail in FIG. 2.

The display 70 includes an electrophoresis display element 71 which is integrated with the EL element (electroluminescence element) 13 behind the element 71. The EL element 13 is at least partly transparent. The following description will be presented assuming that the EL element 13 and the electrophoresis display element 71 are driven by simple matrix addressing scheme; alternatively, the elements may be driven by active matrix scheme. The EL element 13 may be, for example, an organic EL element. The electrophoresis display element 71 is one example of reflective display elements.

The EL element 13 has on a transparent substrate 19 a light-emitting layer 5 covered with a transparent substrate 20. The transparent substrate 20 is adhered firmly to a front transparent substrate 21 in the electrophoresis display element 71 so as to provide an integral structure between the EL element 13 and the electrophoresis display element 71.

The electrophoresis display element 71 as a reflective display element includes an electrophoresis layer 72 interposed between the transparent substrate 21 and the transparent substrate 22. A transparent electrode 24 is provided on the inner face of the transparent substrate 21, and a transparent electrode 25 is provided on an inner face of the transparent substrate 22.

As indicated by arrows in FIG. 22, in the display 70 in a bright state, the light emitted by the light-emitting layer 5 exits the device toward the observer 15 as direct light L1 taking a direct exit path and reflected light L2 taking a path reflected at the electrophoresis layer 72. Having passed through the EL element 13, ambient light L3 enters the electrophoresis layer 72 in the electrophoresis display element 71 from which the light is reflected and exits toward the observer 15. Therefore, the display 70 is capable of utilizing, in addition to the direct light L1 and the reflected light L2, the ambient light L3 in display operations, thereby achieving a very bright screen. In the case of a dark screen, the light-emitting layer 5 emits no light, and the ambient light L3 is absorbed by the electrophoresis layer 72 before being visible to the observer, thereby achieving a good dark state.

As described in the above, the display 70 of the present embodiment incorporates as a reflective display not a polarizing plate, but the electrophoresis display element 71 which depends for operation on the movement of charged colorant in a medium placed in an electric field.

The following is a detailed description of the electrophoresis display element 71.

Figure 23:
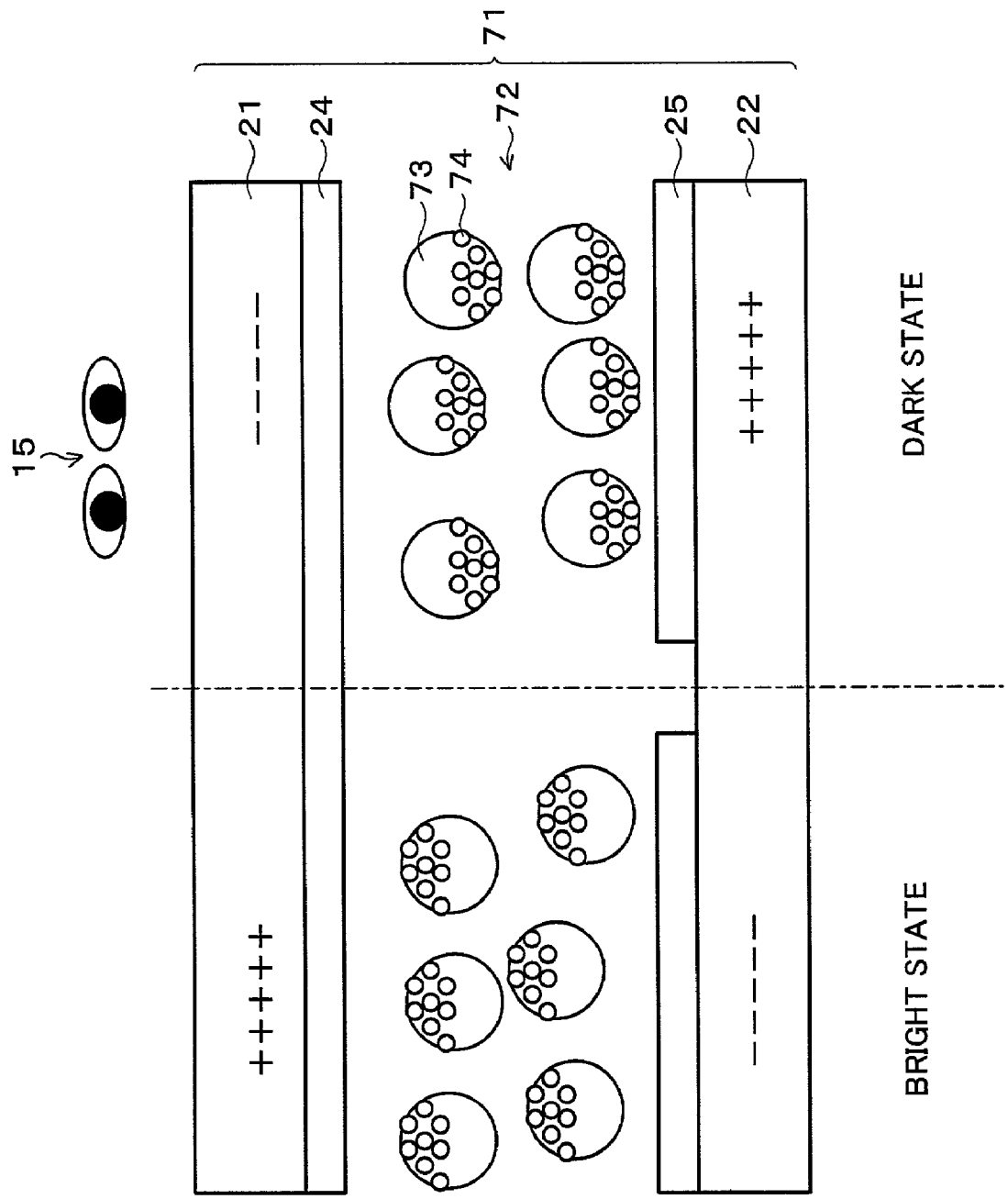
FIG. 23 is an illustration depicting how the electrophoresis display element in FIG. 22 operates.

FIG. 23 is a cross-sectional view of the electrophoresis display element 71. In the electrophoresis display element 71, for example, two glass substrates 21, 22, one of which is transparent to light, are positioned facing each other with a predetermined distance separating them. A pair of planar transparent electrodes 24, 25 are formed of ITO or other material on the inner, opposing surface of the glass substrates 21, 22.

The two glass substrates 21, 22 has an electrophoresis layer 72 interposed therebetween. The electrophoresis layer 72 includes a colored dispersion medium 73 and charged colorant 74 enclosed in the form of microcapsules. The dispersion medium 73 is colored, for example, in black and the colorant 74 is, for example, white and dispersed in the colored dispersion medium 73. The white colorant 74 is contained in parts of the colored dispersion medium 73, for example, encapsulated in the hemispheres of spherical colored dispersion medium 73.

In the electrophoresis display element 71, if a voltage is applied to the pair of transparent electrodes 24, 25 so that the upper transparent electrode 24 has a higher potential than the lower transparent electrode 25, for example, as shown in the bright state in FIG. 23, the negatively charged white colorant 74 is moved in the colored dispersion medium 73 by Coulomb's force to the anode (transparent electrode 24) and sticks to the anode (upper transparent electrode 24). Observing the electrophoresis display element 71 in this state from the side of the glass substrate 21, the observer 15 can see white color in a part where the white colorant 74 sticks forming a layer through the transparent electrode 24 and the glass substrate 21.

If the potential gradient between the transparent electrodes 24, 25 is reversed, as shown in the dark state in FIG. 23, the white colorant 74 sticks to the other transparent electrode 25, forming a layer thereon. Observing the electrophoresis display element 71 from the side of the glass substrate 21, the observer 15 sees the electrophoresis display element 71 in black with the white colorant 74 moving behind the black dispersion medium 73.

If the applied voltage is removed, the white colorant layer 74 sticking to the transparent electrode 25 stays in the state. Therefore, once the white colorant layer 74 has stuck to the transparent electrode 25, no voltage application is needed except for the purpose of keeping the stuck state. As could be understood from the description, the workings of the display 70 involve no polarizing plate and constitutes a bright reflective display.

The EL element 13 may have the same structure with no modification as in embodiment 1 shown in FIG. 2. The figure is a cross-sectional view showing only the EL element 13 in the display 12. In the EL element 13 in the figure, the transparent substrates 19, 20 needs be made of optically transparent material, for example, plastics, glass, ceramics, or other suitable transparent material. The substrate 20 is preferably as thin as possible to avoid deterioration of display quality of the electrophoresis display element 71 (reflective display element 14). The transparent electrode 3, acting as an anode, may be made of an electrically conductive and optically transmissive material, such as ITO or SnO$_2$.

The display 70 of the present embodiment is used with the EL element 13 powered off, for example, during daytime when ambient light is abundant and powered on, for example, in a dark environment. The power-on/off may be, for example, manually done (switching scheme by means of a manual switching device), in which instance, the manual switching device may have various structures. The EL element 13 may be automatically powered on/off using, for example, a light sensor. The EL element 13 may function as a light source for the electrophoresis display element 71 in its display operations as well as operate alone to produce displays.

General frontlights are of light-guiding plate types and do not switch between screen states depending on display contents. They are simply turned on/off across the entire screen. Therefore, the display with the EL element 13 in accordance with the present invention is totally different from the conventional display with a frontlight. The EL element 13 incorporated in the display in accordance with the present invention includes simple- or active-matrix-drive electrodes forming pixels which are controlled individually to light on/off according to display data.

As detailed above, the display 70 operates in three different modes depending on external light conditions: the electrophoresis display element 71 is driven alone, the EL element 13 is driven alone, or both elements are driven simultaneously. In addition, the display 70 is thin and lightweight.

Embodiment 11

Figure 24:
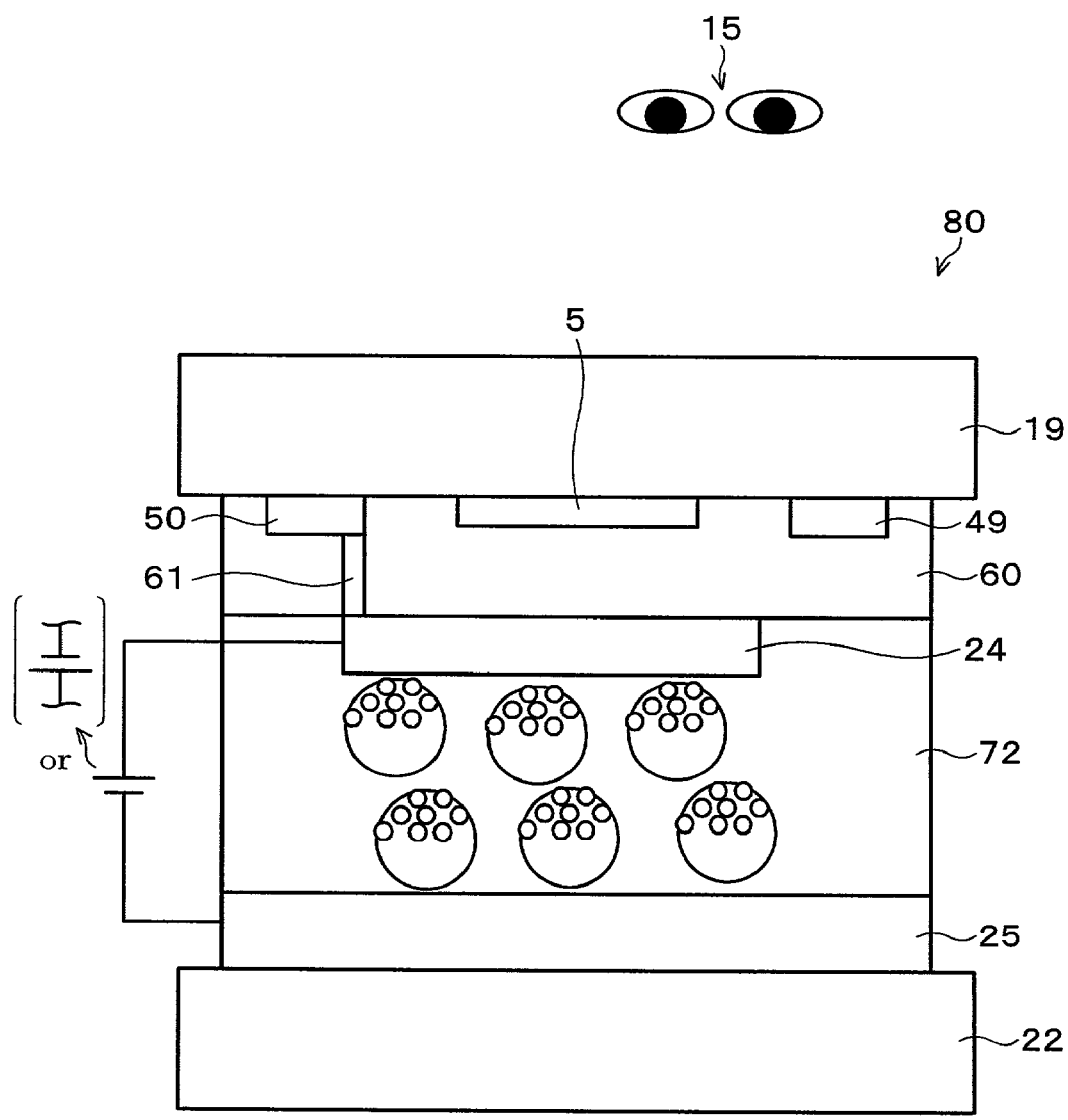
FIG. 24 is a schematic cross-sectional view of a yet another embodiment of a display in accordance with the present invention.
Figure 25:
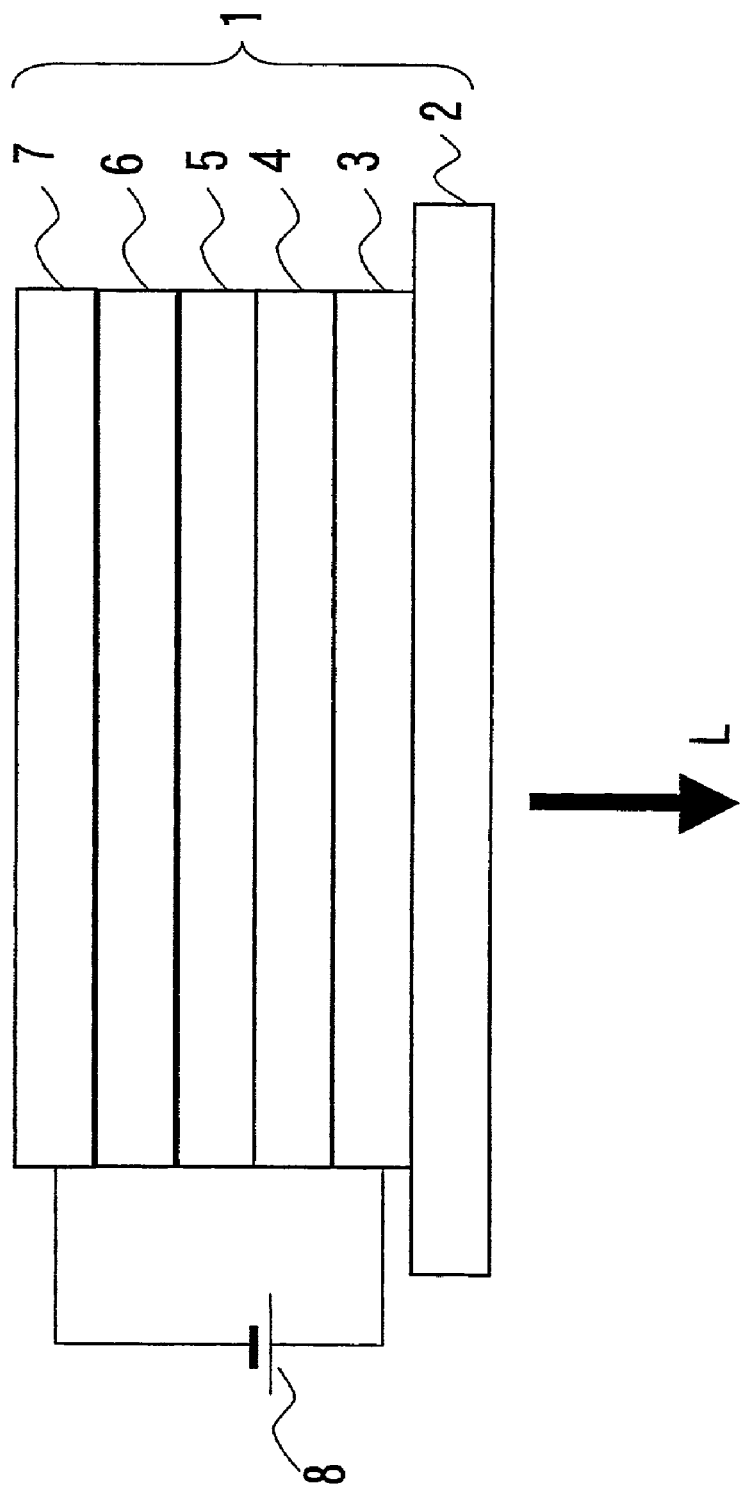
FIG. 25 is a cross-sectional view of a conventional EL element.
Figure 26:
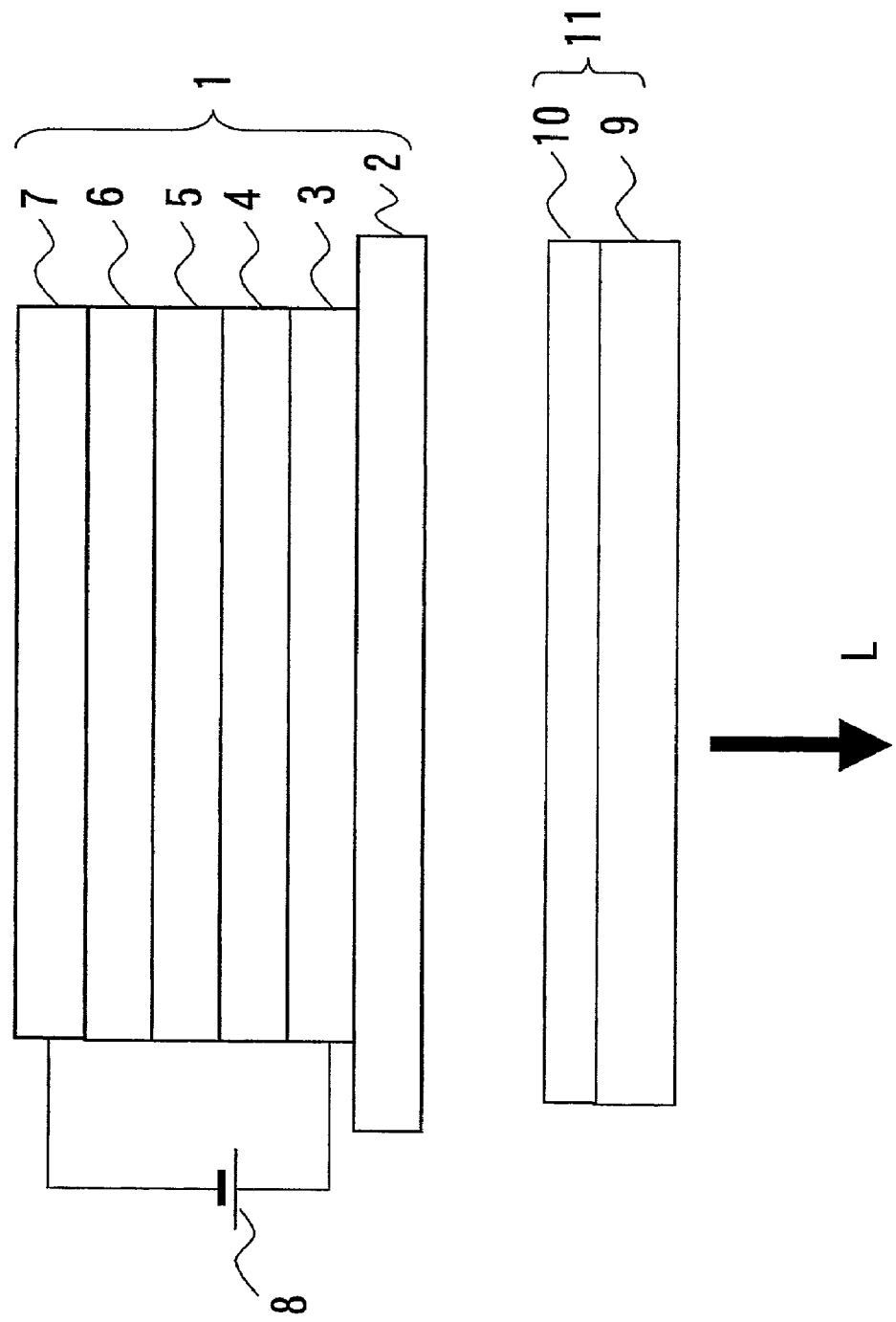
FIG. 26 is a cross-sectional view of an EL element fabricated in accordance with a conventional reflect prevention method.

The following will describe another embodiment in accordance with the present invention in reference to FIG. 24.

FIG. 24 is a schematic illustration of a display 80 of embodiment 11 in accordance with the present invention. As the figure shows, in the display 80, a light-emitting layer 5 as an EL (electroluminescence) element is provided on the same transparent substrate 19 as is a transparent electrode 24 for driving an electrophoresis layer 72. Including only two transparent substrates (transparent substrate 19 and transparent substrate 22), the display 80 is thinner and more lightweight. FIG. 24 is an enlarged cross-sectional view of a single pixel.

In the display 80, on the transparent substrate 19 are there provided an active element 49 which controls the light-emitting layer 5 and an active element 50 which controls the electrophoresis layer 72. A transparent protection film 60 is provided on the active elements 49, 50. The active element 50 is connected through a contact hole 61 to the transparent electrode 24 which drives the electrophoresis layer 73.

Each of the active elements 49, 50 may be a 3-terminal element typically exemplified by a TFT (thin film transistor) or a 2-terminal active matrix element typically exemplified by an MIM (metal-insulator-metal) structure. In the present embodiment, the light-emitting layer 5 and the electrophoresis layer 72 may be individually controlled by separate, for example, TFTs (active elements 49, 50). Two or more TFTs are preferably provided for the purpose of controlling the light-emitting layer 5.

The reflective display element is not necessarily an electrophoresis display element or a liquid crystal display element with a single polarizing plate introduced in the foregoing, and may be, for example, a guest-host liquid crystal with no polarizing plate, a so-called Gyricon display of a twist ball type, or a reflective display which depends on toner movement under the influence of an electric field for operation. These alternatives are also applicable to the display in accordance with the present invention.

As detailed above, the present invention achieves environment dependent types of displays.

A display in accordance with the present invention, as described in the foregoing, includes a reflective display element behind an EL element and circularly polarizing means on the side facing the observer, and the EL element acts as a display element and also provides display illumination for the reflective display element. Alternatively, a reflective display element is provided behind an EL element, and the EL element and the reflective display element are independently controllable in terms of display operations.

Therefore, the light emitted by the EL element is reflected at sufficient amounts to the side of the reflective display element, which makes it possible to increase the amount of light exiting the display. A display is thus realized which is thin, lightweight, and capable of producing good displays in any illumination conditions.

The EL element is capable of playing a dual role of a display illumination and a display element during daytime when the reflective display element shows variable visibility depending on ambient light. In dark places, the observer will turn on the EL element to light up the screen sufficiently to recognize information displayed by the reflective display element. Although the EL element is emissive, it can use ambient light. Visibility is achieved which depends on surrounding conditions.

A structure in which circularly polarizing means is provided in front causes no shadow images in a dark state and removes reflection from the interface, thereby producing displays of high contrast. The structure offers novel types of displays that allow a user to select one of various display modes at his/her own discretion according to surrounding conditions.

Making use of a polarized-light-emitting layer enables to guide light emitted more efficiently to the outside. The display may be adapted so that the reflective display element includes either a liquid crystal birefringence modulation layer or an inorganic birefringence modulation layer sandwiched between two substrates at least one of which is transparent.

The display may be adapted so that the EL element includes a light-emitting layer made of an organic or inorganic material.

The display may be adapted so that the circularly polarizing member includes one polarizing plate and at least one wave plate.

The feature arrangement realizes high luminance displays owing to the EL element where ambient light is insufficient. Where ambient light is intense, the reflective display element changes its luminance in proportion to ambient light and makes the displayed contents more easily recognizable, and no washout occurs which does occur in conventional light-emitting displays and transmissive liquid crystal displays.

The display, on top of the feature arrangement above, may be adapted so that the EL element and the reflective display element are provided on a common substrate. The structure makes it possible to reduce the device further in thickness and weight.

The display, on top of the feature arrangement above, may be adapted so that it further includes: an active element for driving the EL element; and an active element for driving the reflective display element, wherein the active elements are provided on a common substrate. The structure makes it possible to further reduce the device in thickness and weight.

The display, on top of the feature arrangement above, may be adapted so that: a state in which the substantially circularly polarized light incident to the birefringence modulation layer remains circularly polarized at a reflective surface and becomes circularly polarized in an opposite direction at an exit surface after the reflection is defined as a dark state; and a state in which the substantially circularly polarized light incident to the birefringence modulation layer becomes linearly polarized at a reflective surface and becomes circularly polarized in the same direction as upon entrance at an exit surface after the reflection is defined as a bright state. The structure enables displays with high contrast and utility efficiency.

The display, on top of the feature arrangement above, may be adapted so that: the EL element includes at least a transparent electrode, an organic hole transfer layer, and/or an organic electron transfer layer, an organic light-emitting layer, a metal electrode, and a sealing layer, all stacked sequentially on an optically transparent substrate; and the metal electrode has a transmittance of not less than 50%. The structure produces displays with increased brightness.

The display, on top of the feature arrangement above, may be adapted so that: when a pixel in the EL element is in a bright screen, an associated pixel in the reflective display element simultaneously produces a bright screen, and when a pixel in the EL element is in a dark screen, an associated pixel in the reflective display element simultaneously produces a dark screen. The structure ensures visibility.

The display, on top of the feature arrangement above, may be adapted so that: all pixels in the reflective display element always produce a dark screen irrespective of the display state of a pixel in the EL element, be it light-emitting or non-light-emitting. The structure ensures visibility.

The display, on top of one of the feature arrangements above, may be adapted so that: all pixels in the EL element are always in a non-light-emitting state and those in the reflective display element produce bright to a dark screen. The structure ensures visibility and reduces power consumption.

The display incorporates a reflective display element and therefore exhibits a low power consumption feature like conventional reflective liquid crystal displays. However, using a highly power-consuming EL element simultaneously and keeping it in a light-on state lead to increases in power consumption. Therefore, using one of the foregoing feature arrangements according to operating conditions is very effective to achieve both low power consumption and high visibility.

The display, on top of the feature arrangement above, may be adapted so that: the circularly polarizing member includes, listed as viewed from the EL element, a first optical phase difference compensating plate of which retardation in a normal direction to a substrate is set to not less than 100 nm and not more than 180 nm, a second optical phase difference compensating plate of which retardation in a normal direction to a substrate is set to not less than 200 nm and not more than 360 nm and a linearly polarizing plate; and $|2\times\theta 2-\theta 1|$ is not less than 35° and not more than 55°, where $\theta 1$ is an angle between either a transmission axis or an absorption axis of the linearly polarizing plate and a retardation axis of the first optical phase difference compensating plate, and $\theta 2$ is an angle between either a transmission axis or an absorption axis of the linearly polarizing plate and a retardation axis of the second optical phase difference compensating plate. The inventors of the present invention obtained through experiments these ranges in which good circularly polarized light can enter a reflective display element. The structure makes it possible to cause good, circularly polarized light to enter the reflective display element.

The display, on top of the feature arrangement above, may be adapted so that:

the circularly polarizing member includes, listed as viewed from the EL element, a first optical phase difference compensating plate of which retardation in a normal direction to a substrate in an optical phase difference compensating plate is set to not less than 100 nm and not more than 180 nm, a second optical phase difference compensating plate of which retardation in a normal direction to a substrate is set to not less than 200 nm and not more than 360 nm, a third optical phase difference compensating plate of which retardation in a normal direction to a substrate is set to not less than 200 nm and not more than 360 nm, and a single polarizing plate; and the polarizing plate and the optical phase difference compensating plates are positioned so as to satisfy $$35° \leq |2 \times \theta 3 - \theta 2 - \theta 1| \leq 55°$$

where θ1, θ2, and θ3 are angles between either a transmission axis or an absorption axis of the polarizing plate and retardation axes of the first, second, and third optical phase difference compensating plates respectively. The inventors of the present invention obtained through experiments these ranges in which better circularly polarized light can enter a reflective display element. The structure makes it possible to cause good, circularly polarized light to enter the reflective display element.

The display, on top of the feature arrangement above, may be adapted so that: there is provided a light-reflecting film to a first substrate; and the light-reflecting film has a smooth, continuously curving lump- and dent-shape and is made of an electrically conducting material, to obtain light-reflecting properties of a reflective display element.

The structure realizes a diffusive reflecting plate which does not cause unnecessary scattering or disturb (depolarize) polarized light as a flat mirror surface does not. This contributes a lot to the improvement of display characteristics, when compared to the provision, in front of a display, of a scattering plate arranged from a non-diffusive mirror surface reflecting plate. In a case in which at least the reflective display element has a light-reflecting film on a substrate opposite to the side facing the observer and reflective displays are produced, the reflective film having a smooth lump- and dent-shape is effective in preventing mirror surface phenomena from developing in reflective displays.

The display, on top of the feature arrangement above, may be adapted so that: the reflective film in the reflective display element is arranged from an inorganic dielectric mirror or an organic hologram reflective plate. The structure produces good color displays.

The display, on top of the feature arrangement above, may be adapted so that: there is provided a color filter layer behind the circularly polarizing member. The structure produces good full color displays.

The display, on top of the feature arrangement above, may be adapted so that: behind the circularly polarizing member is there provided a pressure-sensitive coordinates-detecting input device which is positioned over a surface of the reflective display element.

Incident light becomes substantially circularly polarized as it passes through the circularly polarizing member. Possible reflection from an interface or the like which does not cause a change in polarization is absorbed by a polarizing plate upon exit. Therefore, the arrangement prevents visibility deterioration due to reflection from the pressure-sensitive input device (touch panel) which is an effective input device for a portable device. Combining the display with the reflect-prevented touch panel allows the display to effectively utilize the circularly polarized light having passed through the touch panel.

The display, on top of the feature arrangement above, may be adapted so that: the EL element emits light which at least satisfies g≠0, g being given by $$g = 2(I_L - I_R)/(I_L + I_R)$$

where $I_R$ is an intensity of right circularly polarized light and $I_L$ is an intensity of left circularly polarized light. The structure makes it possible to more efficiently utilize the light emitted by the EL element.

The present invention makes it possible to use the reflective display under very low or no ambient light, by lighting on the EL element, thus addressing shortcomings of the reflective display and greatly enhancing operating conditions of the reflective display. When the EL element is used for displays, since ambient light is permitted in for displaying purposes, the resultant display element automatically adjust itself to external brightness, which is a feature that could not be found in conventional technology.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A display for processing both external light and light emitted by a light-transmitting EL element, comprising:

circularly polarizing means for selectively transmitting substantially circularly polarized light, either right or left, from the external light;

the light-transmitting EL element; and a reflective display element behind the EL element, wherein the reflective display element is arranged to reflect the circularly polarized light in at least one of the external light and the light emitted by the EL element, wherein die display is operable in at least one mode to transmit the external light to the reflective display element, wherein the circularly polarizing means includes one polarizing plate and at least one wave plate, and wherein: the circularly polarizing means includes two optical phase difference compensating plates and is arranged from, listed as viewed from the EL element, a first optical phase difference compensating plate of which retardation in a normal direction to a substrate is set to not less than 100 nm and not more than 180 nm, a second optical phase difference compensating plate of which retardation in a normal direction to a substrate is set to not less than 200 nm and not more than 360 nm, and a linearly polarizing plate; and the polarizing plate and the optical phase difference compensating plates are positioned so as to satisfy $$35° \leq |2 \times \theta 2 - \theta 1| \leq 55°$$

where θ1 is an angle between either a transmission axis or an absorption axis of the linearly polarizing plate and a retardation axis of the first optical phase difference compensating plate, and θ2 is an angle between either a transmission axis or an absorption axis of the linearly polarizing plate and a retardation axis of the second optical phase difference compensating plate.

2. A display for processing both external light and light emitted by a light-transmitting EL element, comprising:
   circularly polarizing means for selectively transmitting substantially circularly polarized light, either right or left, from the external light;
   the light-transmitting EL element; and
   a reflective display element behind the EL element, wherein the reflective display element is arranged to reflect the circularly polarized light in at least one of the external light and the light emitted by the EL element,
   wherein the display is operable in at least one mode to transmit the external light to the reflective display element,
   wherein the circularly polarizing means includes one polarizing plate and at least one wave plate, and
   wherein the circularly polarizing means includes three optical phase difference compensating plates and is arranged from, listed as viewed from the EL element, a first optical phase difference compensating plate of which retardation in a normal direction to a substrate in an optical phase difference compensating plate is set to not less than 100 nm and not more than 180 nm, a second optical phase difference compensating plate, provided on the first optical phase difference compensating plate, of which retardation in a normal direction to a substrate is set to not less than 200 nm and not more than 360 nm, a third optical phase difference compensating plate, provided on the second optical phase difference compensating plate, of which retardation in a normal direction to a substrate is set to not less than 200 nm and not more than 360 nm, and a single polarizing plate provided on the third optical phase difference compensating plate; arid the polarizing plate and the optical phase difference compensating plates are positioned so as to satisfy $$35° \leq |2\times\theta3-\theta2-\theta1| \leq 55°$$

where $\theta1$, $\theta2$, and $\theta3$ are angles between either a transmission axis or an absorption axis of the polarizing plate and retardation axes of the first, second, and third optical phase difference compensating plates respectively.

3. A display for processing both external light and light emitted by a light-transmitting EL element, comprising:
   circularly polarizing means for selectively transmitting substantially circularly polarized light, either right or left, from the external light;
   the light-transmitting EL element; and
   a reflective display element behind the EL element, wherein the reflective display element is arranged to reflect the circularly polarized light in at least one of the external light and the light emitted by the EL elements,
   wherein the display is operable in at least one mode to transmit the external light to the reflective display element,
   wherein the EL element includes a light-emitting layer made of an organic or inorganic material, and
   wherein the EL element emits light which at least satisfies $g \neq 0$, g being given by $$g=2(I_L-I_R)/(I_L+I_R)$$

where $I_R$ is an intensity of right circularly polarized light and $I_L$ is an intensity of left circularly polarized light.

* * * * *